US 008648583B2

(12) United States Patent
Brown et al.

(10) Patent No.: US 8,648,583 B2
(45) Date of Patent: Feb. 11, 2014

(54) DELAY BLOCK FOR CONTROLLING A DEAD TIME OF A SWITCHING VOLTAGE REGULATOR

(75) Inventors: James E. C. Brown, San Jose, CA (US); Bret Rothenberg, Los Altos, CA (US)

(73) Assignee: R2 Semiconductor, Inc., Sunnyvale, CA (US)

( * ) Notice: Subject to any disclaimer, the term of this patent is extended or adjusted under 35 U.S.C. 154(b) by 257 days.

(21) Appl. No.: 13/225,434

(22) Filed: Sep. 3, 2011

(65) Prior Publication Data

US 2012/0105039 A1    May 3, 2012

Related U.S. Application Data

(63) Continuation-in-part of application No. 12/915,203, filed on Oct. 29, 2010, now Pat. No. 8,395,362.

(51) Int. Cl.
G05F 1/00 (2006.01)
H03K 4/90 (2006.01)
H03L 7/06 (2006.01)

(52) U.S. Cl.
USPC .......................... 323/282; 327/136; 327/149

(58) Field of Classification Search
USPC .......... 323/282; 327/136, 149, 152, 153, 158, 327/161, 182, 183
See application file for complete search history.

(56) References Cited

U.S. PATENT DOCUMENTS

| 7,098,640 | B2 | 8/2006 | Brown | |
|---|---|---|---|---|
| 7,391,194 | B2 | 6/2008 | Brown | |
| 7,446,513 | B2* | 11/2008 | Dikken et al. | 323/271 |
| 7,456,620 | B2 | 11/2008 | Maksimovic et al. | |
| 7,518,350 | B2 | 4/2009 | Leung | |
| 7,589,506 | B2 | 9/2009 | Brown | |
| 7,683,594 | B2* | 3/2010 | Kim et al. | 323/282 |
| 2005/0110475 | A1* | 5/2005 | Chapuis | 323/282 |
| 2008/0024189 | A1* | 1/2008 | Miyazaki | 327/333 |
| 2008/0224677 | A1* | 9/2008 | Kim et al. | 323/282 |
| 2008/0278984 | A1 | 11/2008 | Stanley | |
| 2009/0027021 | A1 | 1/2009 | Dequina | |
| 2009/0033299 | A1* | 2/2009 | Ishino | 323/282 |
| 2009/0237059 | A1 | 9/2009 | Chiba | |
| 2010/0020569 | A1 | 1/2010 | Melanson | |
| 2010/0156376 | A1* | 6/2010 | Fu et al. | 323/283 |

OTHER PUBLICATIONS

"Energy-efficiency on-chip power management: System, circuit and device perspectives", Eduard Alarcon, 2009 IEEE Circuits and Systems Society Distinguished Lecturer Program, Oct. 19, 2009.

(Continued)

*Primary Examiner* — Adolf Berhane
*Assistant Examiner* — Gary Nash
(74) *Attorney, Agent, or Firm* — Brian R Short

(57) ABSTRACT

Embodiments for at least one method and apparatus for controlling timing of switch control signals of a switching voltage regulator disclosed. One method includes generating a regulated output voltage based upon a switching voltage, generating the switching voltage through controlled closing and opening of a series switch element and a shunt switch element, and controlling, by a delay block, the closing and opening of the series switch element and a shunt switch element. The delay block control includes receiving, by the delay block, a timing signal, generating a one of a series switch control signal and a shunt switch control signal by controllably delaying the timing signal with a first delay, and generating one other of the series switch control signal and the shunt switch control signal by inverting, and controllably delaying the timing signal with a second delay.

12 Claims, 21 Drawing Sheets

(56) References Cited

OTHER PUBLICATIONS

"Continuous Time Optimization of Gate Timing for Synchronous Rectification", J. Kimball and P. Krein, 1996 Midwest Symposium on Circuits and Systems p. 1015.

"Autonomous control technique for high-performance switches", P. Krein and R. Bass, IEEE Trans. Industrial Electronics, v. 39, p. 215 (1992).

"Predictive Gate Drive Boosts Synchronous DC/DC Power Converter Efficiency", Application Report SLUA281, Steve Mappus, Texas Instruments, Inc., Apr. 2003.

"Digital Multimode Buck Converter Control With Loss-Minimizing Synchronous Rectifier Adaptation", A. Peterchev and S. Sanders, IEEE Trans Power Elect v 21 p. 1588 (2006).

"Sensorless Optimization of Dead Times in DC-DC Converters with Synchronous Rectifiers", V. Yousefzadeh and D. Maksimovic, IEEE Trans Power Elect v 21 p. 994 (2006).

\* cited by examiner

DELAY BLOCK FOR CONTROLLING A DEAD TIME OF A SWITCHING VOLTAGE REGULATOR

RELATED APPLICATIONS

This patent application is a continuation-in-part of U.S. patent application Ser. No. 12/915,203, filed Oct. 29, 2010 now U.S. Pat. No. 8,395,362.

FIELD OF THE DESCRIBED EMBODIMENTS

The described embodiments relate generally to power conversion. More particularly, the described embodiments relate to methods and apparatuses for controlling a dead time of a switching voltage regulator.

BACKGROUND

Switched-mode DC-DC converters are commonly used to provide the voltage required for operating electronic circuits from a differing supply voltage with minimal losses. An example of a DC-DC converter (in this case a buck converter, configured to reduce the supply voltage) is depicted in FIG. 1. Although a buck converter is shown in FIG. 1, it is to be understood that the discussion below applies to any converter configuration.

In the configuration shown in FIG. 1, the series switch (hereinafter SW1) and the shunt switch (hereinafter SW2) are alternately closed in order to provide a varying output voltage to the load. Simplified control waveforms for the switches are depicted in FIG. 2. When the series switch SW1 is on, current flows from the input voltage through SW1 to the output inductor $L_{out}$. When the series switch SW1 is off, and the shunt switch SW2 is on, the inductor draws current from the ground node through SW2, which acts as a synchronous rectifier. (It is also possible to have the current decrease to 0 or become negative during this portion of the operating cycle.) The duty cycle D is defined as the proportion of time during which SW1 is on:

$$D = \frac{T_{on}}{T_{on} + T_{off}}$$

In normal steady-state continuous-mode operation, when parasitic losses can be neglected, the output voltage is proportional to the duty cycle:

$$V_{out} = DV_{in}$$

If both switches are on simultaneously, current can flow through them directly from the input voltage supply to ground. This "shoot-through" current can be very large, since its only impediment is the on-resistance of the switches. Shoot-through current does not flow through the load and so is wasted, degrading the efficiency of the converter. Therefore, shoot-through is to be avoided. In order to accomplish this end, "dead times" are normally provided at the end of each switch on-time, during which both switches are off.

During the dead times, current continues to flow due to the influence of the typically large-value output inductor $L_{out}$. Since both switches are open, this current will charge or discharge the parasitic capacitance of the switch node, which is typically small. As a consequence it is often the case that the potential at the switch node $V_{SW}$, hereinafter referred to as the switching voltage, will change rapidly during the dead times. In the typical continuous-conduction case where the current through the inductor is positive at all times in the switching cycle, the voltage $V_{SW}$ will fall (become more negative), as depicted in FIG. 3.

During the dead time DT1, at the beginning of which the switch potential is already near 0, $V_{SW}$ becomes negative. If DT1 is too long, the body diode of the switch FET SW2 turns on (or the FET itself will turn on as an MOS diode), and current starts to flow out of the diode into the output inductor. Body diode current degrades converter efficiency, due to dissipation as it flows through the diode of $P=I_B V_F$, where $V_F$ is the forward voltage of the diode and $I_B$ is the body-diode current. The forward voltage of a junction diode is typically about 0.7 V (for MOSFET devices, the diode voltage can be higher or lower than 0.7V, but there is still loss). In application where the output voltage is modest (e.g. 1 to 5 V), this represents a substantial additional loss mechanism. Therefore, when current flow through the output inductor is positive during DT1, it is best to make the dead time DT1 as short as possible consistent with avoiding shoot-through current.

Note that in the case where the instantaneous current flowing through the inductor is negative during DT1, the voltage $V_{SW}$ increases towards $V_{IN}$ during the dead time. The best efficiency is obtained when DT1 is long enough that the node voltage reaches $V_{IN}$, at which point SW1 is turned on. Since there is no voltage across SW1 when it is turned on, there is no switching loss. This is known as Zero Voltage Switching (ZVS). However, for small negative currents, long dead times are needed, so efficiency benefits must be balanced against duty cycle constraints, as described below.

During the dead time DT2, at the beginning of which the switch potential is near the input potential $V_{IN}$, $V_{SW}$ falls towards 0, discharging charge stored on the parasitic capacitance of the $V_{SW}$ node into the load. If SW2 is turned on at the moment that $V_{SW}$ reaches 0 V, all the energy stored in SW2 will have flowed to the load, and since there is no voltage across SW2 at the moment of switching, there is no power dissipated during the switching transition (This is ZVS operation for DT2). If DT2 is allowed to become too long, the switch node voltage again becomes negative, and body diode current may flow, increasing dissipation and decreasing efficiency. It is desirable to choose DT2 to approximate ZVS as closely as possible to achieve maximum efficiency, without extending the time excessively so as to avoid body diode current.

The dead times required for efficient operation vary with the node capacitances, output inductance, applied voltage, and output current. In applications where the output current is substantially constant and known a priori, it may be possible to use fixed values for both DT1 and DT2 and achieve good efficiency. However, in applications where the output current experiences wide and frequent variations, dead time adjustments are helpful for maintaining good efficiency. This is of particular import for high-frequency converters using switching frequencies $f_{SW}>10$ MHz, since the loss associated with switching transitions is linear in the frequency of occurrence of those transitions.

Therefore, it is of interest to adjust the dead times used in converter operation to obtain optimal efficiency, particularly in the case where output voltages comparable to the forward voltage of the body diode are contemplated.

A variety of approaches have been reported to achieve this end. The dead times may be set by design, but in this case variations in device characteristics due to processing variations are not accounted for, and changes in load current cannot be accommodated without degraded efficiency. In order to avoid shoot-through current, dead times must be set excessively long, leading to low efficiency from body-diode conduction. Adjustments may be made in the dead times when the final device or assembly is tested, to correct for process variations, but variations in temperature and operating current are not accounted for, again forcing the adjusted dead times to be set conservatively to avoid shoot-through current, thereby failing to achieve optimal efficiency.

Adaptive gate control may be used, in which the zero-crossing times are sensed directly by gates attached to the switching node and the SW2 control node. Such techniques are suitable for low-frequency converters (with switching frequencies of 100 kHz or less). However, when higher frequencies are used, especially in high-frequency converters using switching frequencies $f_{SW}>10$ MHz, the delays in the control circuitry are comparable to the switching times, and accurate operation is difficult to achieve.

Predictive control of dead times, in which overlap in one switch cycle is used to adjust the dead time employed in the next switch cycle, has been reported. Predictive and loop control methods correct for the sensitivity of the control procedure to delays in the sensing circuitry, but require that zero crossings be accurately detected, which is again difficult in the case of high-frequency operation.

The use of converter duty cycle D as a surrogate for efficiency has been described. The duty cycle required to produce a given output voltage is minimized when dissipation in the converter is minimized. Dead times DT1 and DT2 may be adjusted while monitoring the resulting changes in the duty cycle, until a minimum in duty cycle D is found. This approach does not require fast sensing of the switching node, but because the derivative of D with respect to the dead times is being measured, it is necessary to wait for the controller to stabilize for each measurement if good accuracy is to be obtained.

The use of duty cycle optimization for dead time control is acceptable when adaptation of the dead times is infrequent and long adaptation periods are allowed. However, in applications where load conditions change frequently and adaptation must proceed quickly, such long calibration times are not acceptable. For example, when a converter is used to supply a power amplifier used in Wideband Code-Division Multiplexed (WCDMA) communications, the transmitted power is modified for each 667-microsecond slot during closed-loop power control. Improved system efficiency is achieved by changing the voltage supplied to the power amplifier each time the requested RF power is changed. Any calibration process must take place in a time much shorter than 667 microseconds to be useful. If twenty steps are required to optimize each dead time, and each step requires 100 switching periods to perform, a conventional 1 MHz converter requires 4 milliseconds to find the optimal dead times, much longer than the slot time. Even if a much higher switching frequency (for example, 20 MHz) is used, 200 microseconds is required to establish optimal values for operation in a 667-microsecond slot, which is relatively wasteful.

Finally, some methods include the use of a memory or lookup table, possibly in combination with dead-time-based calibration, for fast dead time adaptation. This approach provides rapid adaptation if fast memory access is available. However, appropriate sensors are required, at least for the DC output current. While it is straightforward to sense output current using a resistive sensor, efficiency is degraded when a large sense resistance is employed, and noise margins are degraded if a small resistor is used. Various alternatives for current sensing have been reported, but these approaches generally add to power consumption and thus degrade efficiency. Furthermore, in any lookup table approach, a relatively complex periodic calibration is required to guard against variations in temperature and device aging.

It is desirable to have methods and apparatus for setting optimal device times in a switched-mode converter which are fast, adaptable to varying temperatures, voltages, and currents, and suitable for use with high switching frequencies.

SUMMARY

An embodiment includes a method of controlling timing of switch control signals of a switching voltage regulator. The method includes generating a regulated output voltage based upon a switching voltage, generating the switching voltage through controlled closing and opening of a series switch element and a shunt switch element, and controlling, by a delay block, the closing and opening of the series switch element and a shunt switch element. The controlling by the delay block includes receiving, by the delay block, a timing signal, generating a one of a series switch control signal and a shunt switch control signal by controllably delaying the timing signal with a delay Tnon-overlap, and a delay Tskew_var, and generating another one of the series switch control signal and the shunt switch control signal by inverting, and controllably delaying the timing signal with a fixed delay Tnon-overlap and a fixed delay Tskew_fixed.

Another embodiment includes a method of controlling timing of switch control signals of a switching voltage regulator. The method includes generating a regulated output voltage based upon a switching voltage, generating the switching voltage through controlled closing and opening of a series switch element and a shunt switch element, and controlling, by a delay block, the closing and opening of the series switch element and a shunt switch element. The delay block control includes receiving, by the delay block, a timing signal, generating a one of a series switch control signal and a shunt switch control signal by controllably delaying the timing signal with a first delay, and generating one other of the series switch control signal and the shunt switch control signal by inverting, and controllably delaying the timing signal with a second delay.

Another method includes a switching voltage regulator. The switching voltage regulator includes a series switch element, a shunt switch element, a switching controller operative to generate a switching voltage through controlled closing and opening of a series switch element and a shunt switch element, and a delay block. The delay block is operative to receive a timing signal, and control the closing and opening of the series switch element and a shunt switch element by generating a one of a series switch control signal and a shunt switch control signal by controllably delaying the timing signal with a first delay, and generating another one of the series switch control signal and the shunt switch control signal by inverting, and controllably delaying the timing signal with a second delay.

Other aspects and advantages of the described embodiments will become apparent from the following detailed description, taken in conjunction with the accompanying drawings, illustrating by way of example the principles of the described embodiments.

DETAILED DESCRIPTION

The described embodiments provide examples of apparatuses and method for controlling dead times of switching voltage regulators. Determinations of the dead times can be based on an observation that during the time period associated with DT1 (a first dead time), the switching voltage $V_{SW}$ intrinsically transitions from a voltage close to the local ground potential, to a voltage close to the supply voltage. Similarly, during the time period associated with DT2 (a second dead time), the switching voltage intrinsically transitions from a voltage close to the supply voltage to a voltage close to ground. The rapidity of the corresponding transition is indicative of the extent to which timing has been optimized. Therefore, peak-detection of the instantaneous time derivative of the switching node voltage $V_{SW}$ can be used to identify optimized timing conditions for both DT1 and DT2. Positive-going and negative-going transitions of $V_{SW}$ are separately detected, and their response to changes in the corresponding dead times enables the best operating condition to be established.

At least some of the described embodiments are particularly well suited to high-frequency converters, with switching frequencies of 10 MHz and above, using fast switching transitions, which, while minimizing switching losses, also ensure large derivative signals to enable accurate measurements.

The use of derivative (rate of change) signals provides cycle-by-cycle response, enabling fast calibrations suitable for use in such applications as driving handset power amplifiers, where as noted above rapid adaptation to changing load conditions is required for good efficiency. Peak-detection of the derivative signals intrinsically identifies the switching edges without the need for precision timing of the measurement relative to the switch control signals.

Figure 1:
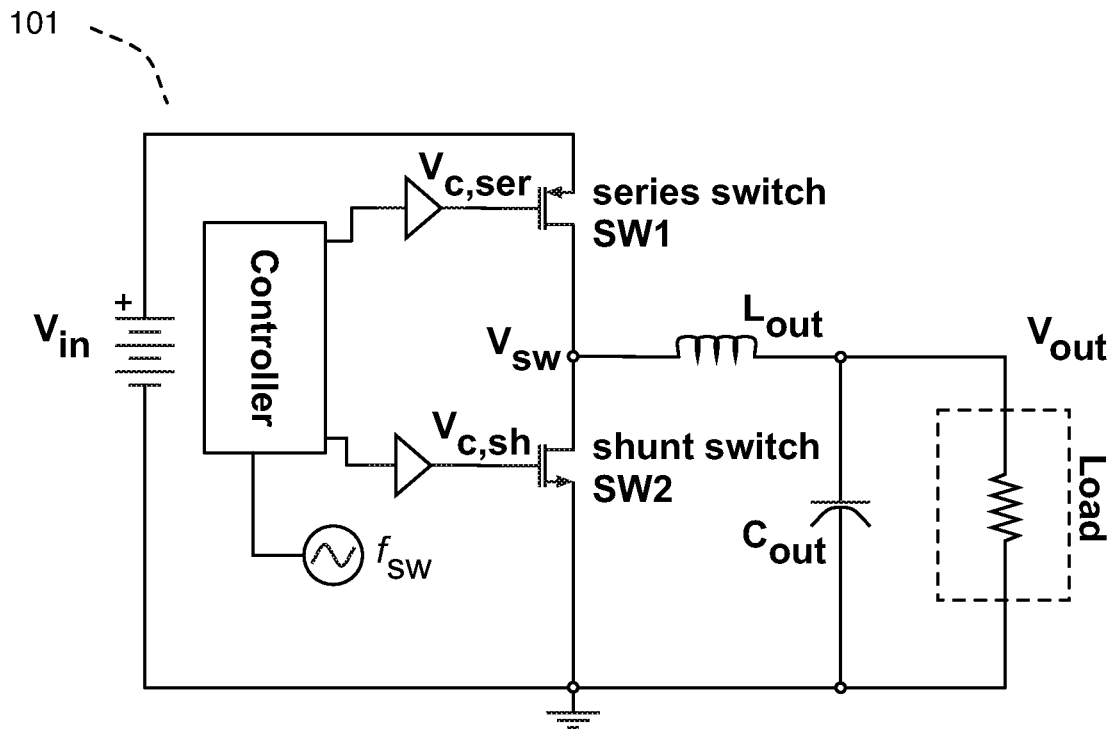
FIG. 1 shows an example of an embodiment of a switched-mode DC-DC converter.
Figure 2:
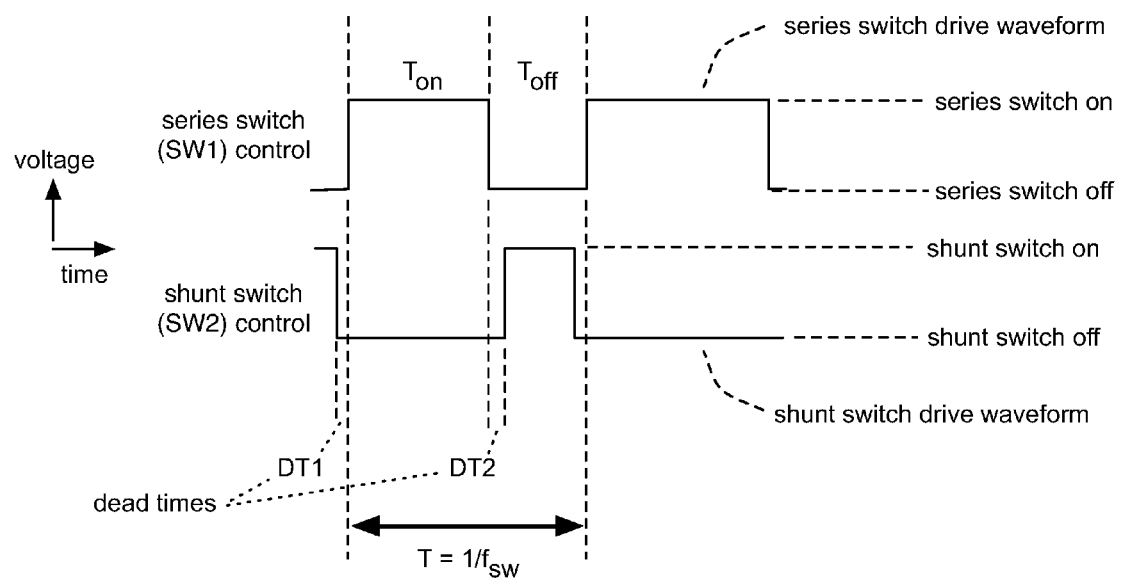
FIG. 2 shows examples of switch control waveforms for the switches of the switched-mode DC-DC converter of FIG. 1.
Figure 3:
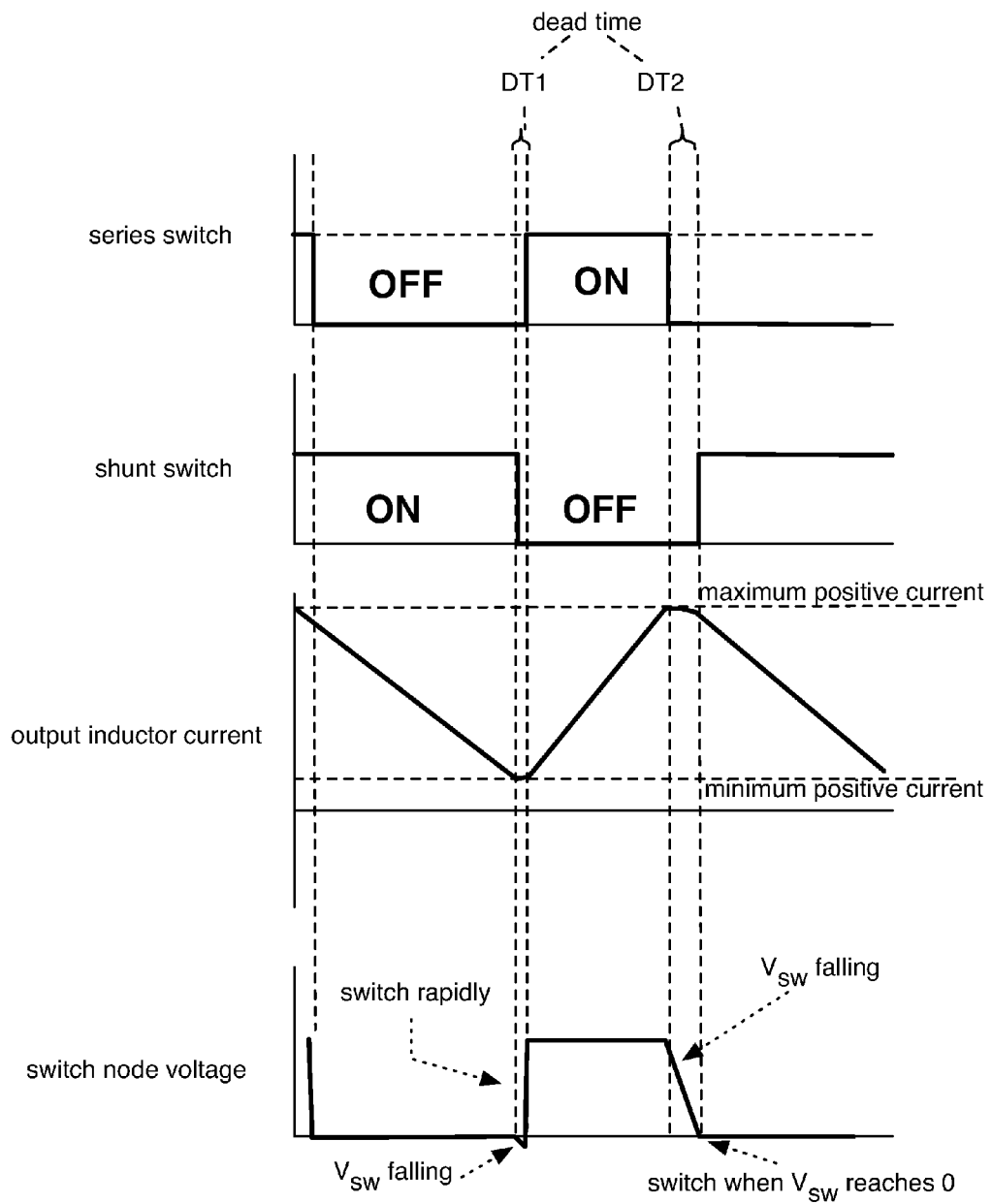
FIG. 3 shows examples of a timing diagram of a switched converter, showing dead times and switch node voltage behavior.
Figure 4:
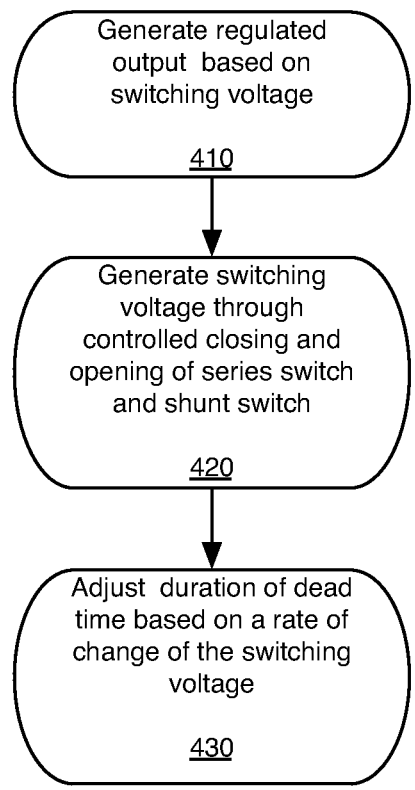
FIG. 4 is a flow chart that includes steps of an example of a method of controlling a dead time of a switching voltage regulator.

FIG. 4 is a flow chart that includes steps of an example of a method of controlling a dead time (DT1 and/or DT2) of a switching voltage regulator. A first step 410 includes generating a regulated output voltage based upon a switching voltage. A second step 420 includes generating the switching voltage through controlled closing and opening of a series switch element and a shunt switch element, wherein the dead time comprises time that both the series switch element and the shunt switch element are open. A third step 430 includes adjusting a duration of the dead time based on a rate of change of the switching voltage.

Embodiments include adjusting the duration of the dead time when triggered. Another embodiment includes adjusting the duration of the dead time every cycle of the switching voltage.

An embodiment further includes determining the rate of change of the switching voltage. As will be shown and described, various methods can be used for determining the rate of change of the switching voltage. An embodiment includes determining the rate of change of the switching voltage by detecting peaks in a time derivative of the switching voltage. Another embodiment includes determining the rate of change of the switching voltage by determining peaks in a slew rate of the switching voltage. Another embodiment includes determining the rate of change of the switching voltage by detecting positive and negative peaks in a time derivative of the switching voltage. Another embodiment includes determining the rate of change of the switching voltage by high-pass-filtering the switching voltage signal.

As previously described, the dead time includes a first dead time (DT1) and a second dead time (DT2). For an embodiment, the first dead time includes time after the shunt switch element is turned off and preceding the series switch element being turned on. For an embodiment, the second dead time includes time after the series switch element is turned off and preceding the shunt switch element being turned on.

For an embodiment, adjusting the duration of the first dead time based on values of the detected peaks comprises adjusting the duration of the first dead time to minimize a positive peak value of a derivative of the switching voltage. For a more specific embodiment, adjusting the a duration of the first dead time based on values of the detected peaks includes adjusting the duration of the first dead time to reduce a positive peak value of the derivative of the switching voltage.

For an embodiment, the duration of the second dead time is adjusted to yield a smallest magnitude of a peak value of a negative time derivative of the switching voltage. Another embodiment includes adjusting the duration of the second dead time to yield a reduced magnitude of a peak value of a negative time derivative of the switching voltage. A more specific embodiment includes further adjusting the duration of the second dead time to yield a largest change in the negative peak between successive dead time settings.

Figure 5:
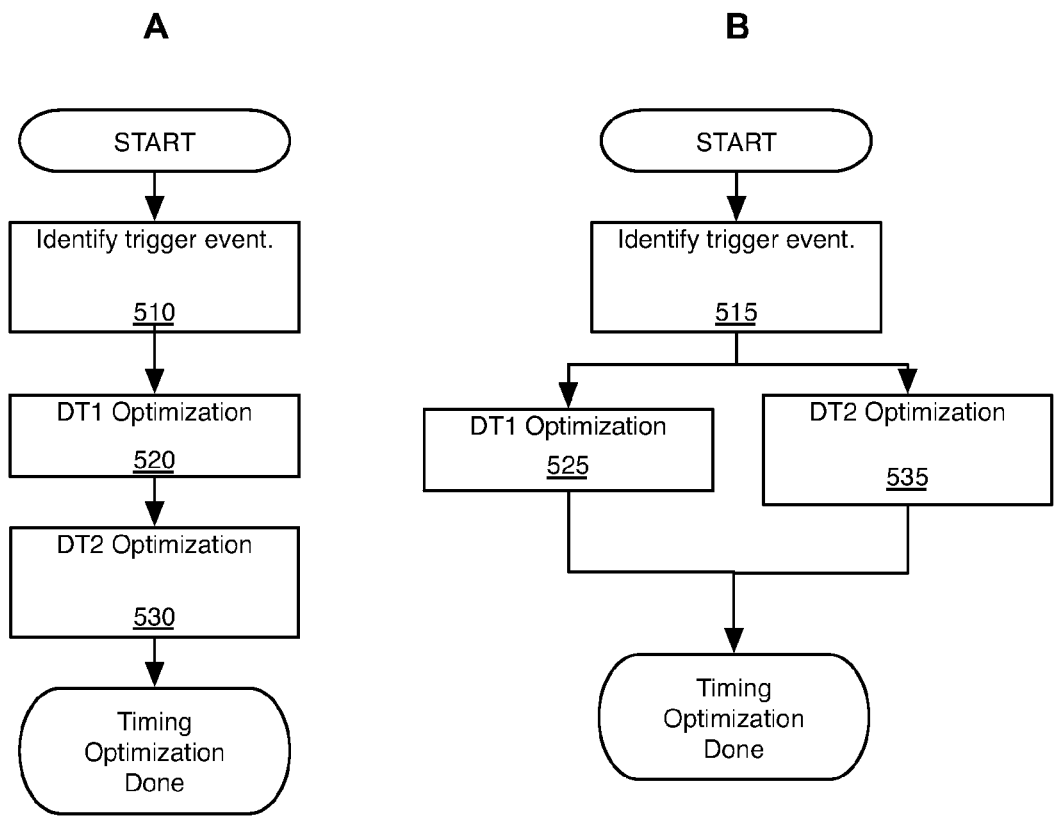
FIGS. 5A and 5B are flow charts showing examples of methods for optimizing a first dead time (DT1) and a second dead time (DT2).

FIGS. 5A and 5B are flow charts that include steps of examples of methods of selecting the first and second dead times (DT1, DT2). The methods include an optimization sequence that is initiated when an appropriate trigger event is identified. The trigger event for optimization is application-dependent. A trigger event (steps 510, 515) may be a logical signal provided to the DC-DC converter by the system in which it is embedded, indicating that optimization is to be performed; such a signal may be controlled by system software or firmware and may be sent as a result of any appropriate system event, such as system initialization, expiration of a fixed or variable optimization delay, a change in required voltage or expected load for the DC-DC converter, or any other condition indicating or requiring that dead time optimization be performed. The trigger event can also be detected internally within the DC-DC converter. In an embodiment in which the converter output voltage is controlled by an analog input signal, optimization can be triggered whenever the analog input signal changes by more than a threshold value. In an alternative embodiment, in which the converter output voltage is controlled by one or more digital input bits, optimization can be triggered whenever any input bit is changed, or whenever a change in input bits corresponds to a change in output voltage greater than a threshold value. In an alternative embodiment, an optimization may be triggered either by a change in the requested output voltage as above, or by a logical signal provided by the system, indicating a change in load conditions not necessarily related to a change in output voltage.

When the trigger event has occurred, an optional skew calibration step may be performed prior to initiating dead time optimization. This step ensures that the time SW1 is on is accurately centered within the time SW2 is off, thus correcting for any differences in delays in the SW1 and SW2 control circuits. If the circuit timing is sufficiently stable, this step may be skipped altogether, or performed only once at the time a given circuit or module is initially tested.

Once any skew calibration step is complete, the dead times may be optimized. This operation may be performed sequentially, as shown in flow chart of FIG. 5A of the figure, with dead time DT1 set to an optimal value (step 520), followed by DT2 (step 530), or vice versa. In an alternative embodiment, the two dead time optimizations may be performed simultaneously, or may be interleaved (in that adjustments are alternately made to DT1 and then DT2, in a repeating cycle), as shown (steps 525, 535) in flow chart of the FIG. 5B. Once optimal values of both dead times have been obtained, the optimization process is complete until the next trigger event is identified.

Calibration of Dead Time 1

Dead time DT1 occurs after the shunt switch SW2 is turned off, but before the series switch SW1 is turned on. The overall result of these two steps is to change the switch node potential $V_{SW}$ from a value close to ground (0 V) to a value close to the supply voltage $V_{IN}$. In the typical case where the supply voltage is positive, this corresponds to a net increase in $V_{SW}$, so it is necessary that $dV_{SW}/dt$ be positive for at least a portion of transition between the states SW2 on/SW1 off and SW1 on/SW2 off.

The magnitude of the peak of this derivative signal $dV_{SW}/dt$ depends on the duration of the dead time DT1, and the direction of current flow during the transition. There are two cases to consider: the instantaneous inductor current at the time SW2 turns off (the start of DT1) may be either positive or negative.

Figure 6:
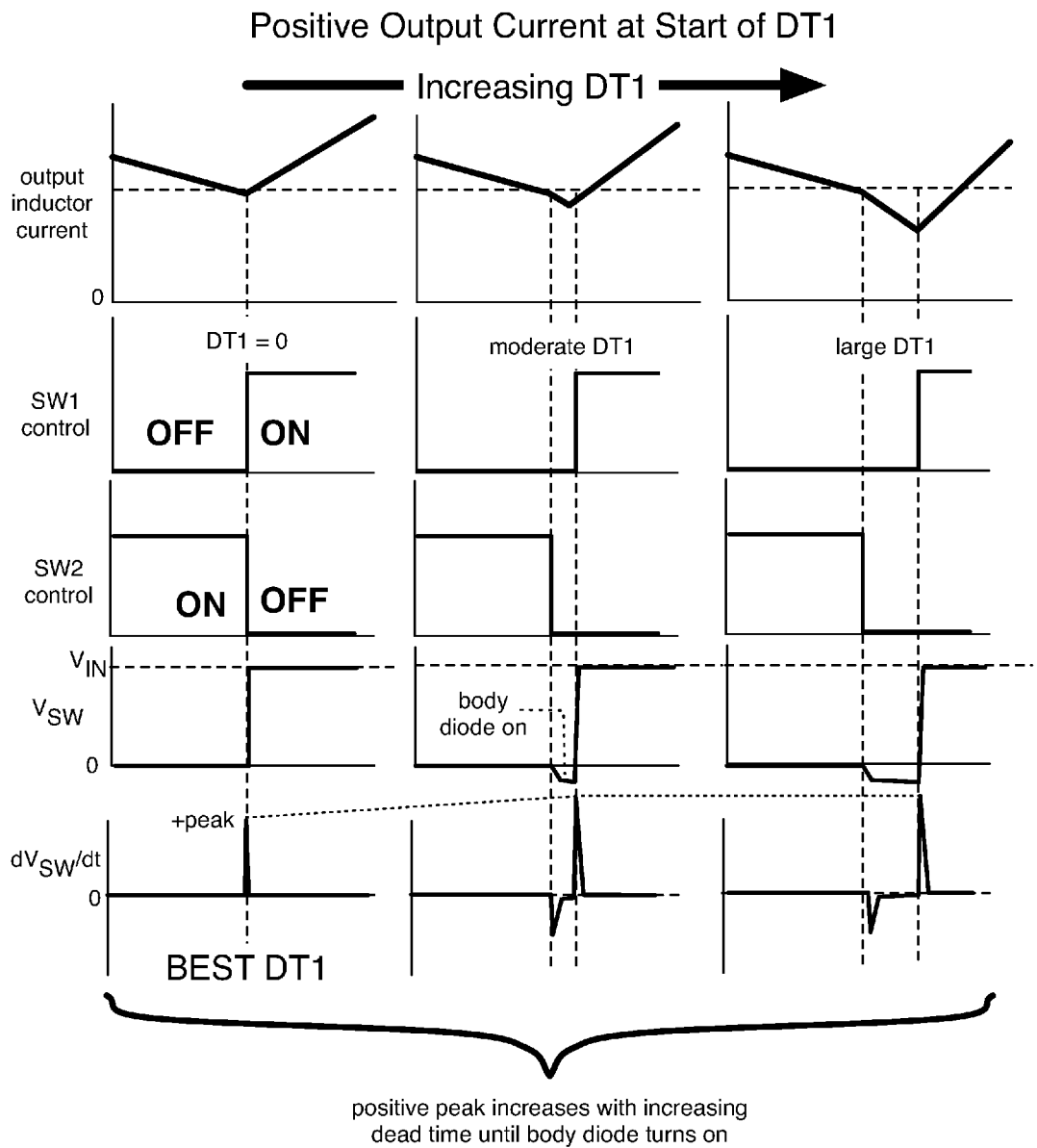
FIG. 6 is a timing diagram that shows an example of the behavior of a switching node potential and time derivative during a first dead time (DT1) when the current through an output inductor is positive during the first dead time (DT1).

The case of positive instantaneous current at the start of DT1 is depicted in FIG. 6. When the inductor current is positive at the moment when SW2 is turned off, the node voltage $V_{SW}$ will be pulled down, becoming more negative than ground with the passing of time. At the end of DT1, SW1 turns on and the node voltage is rapidly pulled up to $V_{IN}$. The derivative signal $dV_{SW}/dt$ will thus display a strong positive peak at the moment SW1 turns on.

When the dead time is essentially 0, there is little time for the node voltage to decrease before SW1 turns on, pulling $V_{SW}$ to $V_{IN}$. However, for longer DT1 duration, the potential at the switch node will become substantial and negative. When a MOSFET switch is in use and DT1 is long enough, the body diode associated with the MOSFET (or MOSFET diode itself) will turn on, allowing current to flow into the node from ground. The diode acts to clamp $V_{SW}$ at $-V_F$, where $V_F$ is the diode forward voltage. Since the current flows at least down the forward voltage of the diode, excess energy is dissipated therein, reducing efficiency. At the moment SW1 turns on, the switch node voltage must step not from 0 to $V_{IN}$, but from $-V_F$ to $V_{IN}$. Thus the positive peak in $dV_{SW}/dt$ increases as dead time increases. For long dead times, the node voltage is clamped by the diode and the positive peak magnitude becomes independent of DT1. Thus, when the inductor current is positive at DT1, the best efficiency is obtained by setting DT1 as close to 0 as practicable (without inducing shoot-through current).

Figure 7:
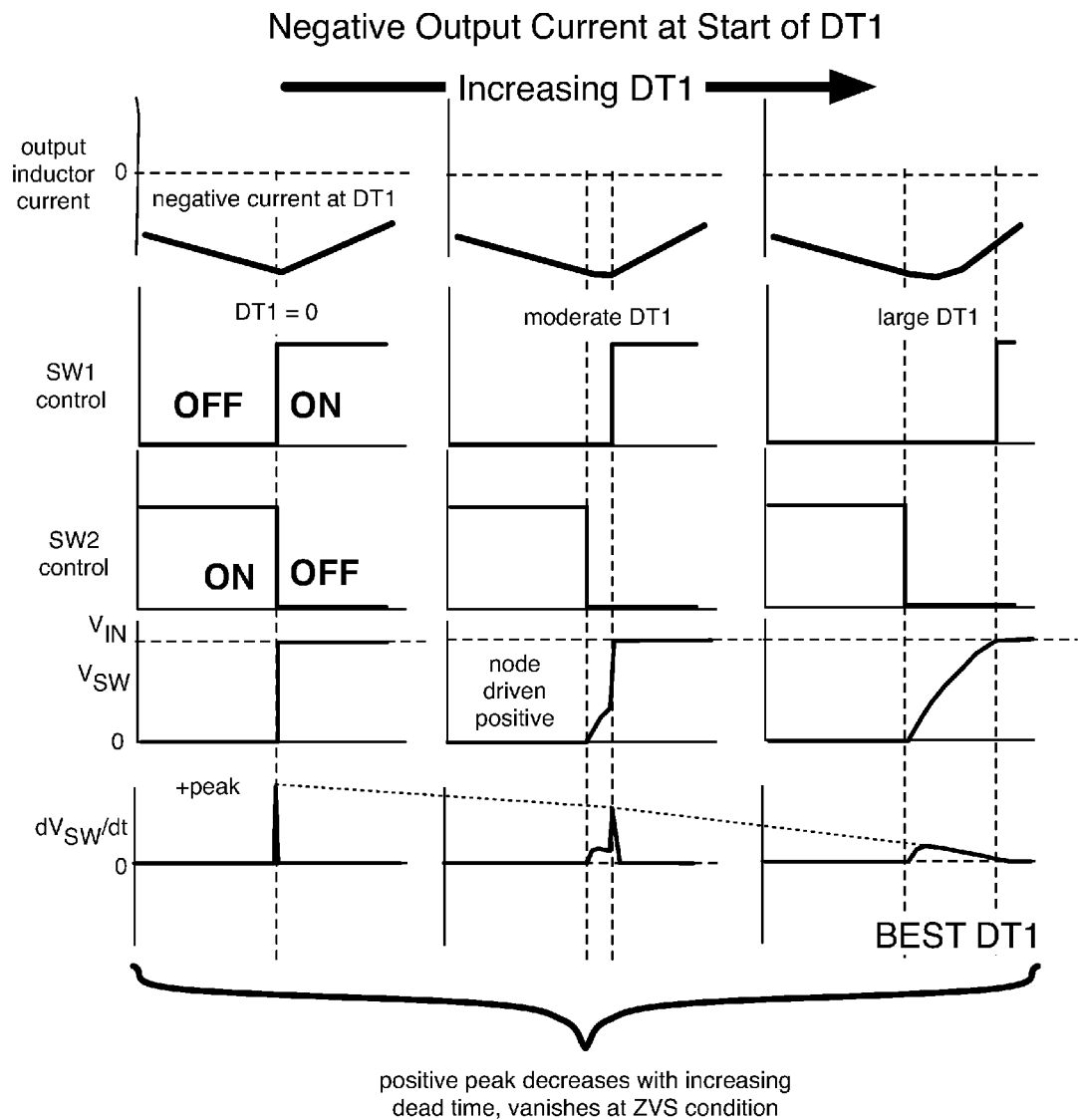
FIG. 7 is a timing diagram that shows an example of the behavior of a switching node potential and time derivative during a first dead time (DT1) when the current through an output inductor is negative during a transition.

The case where instantaneous current is negative at the start of DT1 is depicted in FIG. 7. Instantaneous negative values of inductor current arise when the inductor current peak ripple, which is dependent upon the duty cycle, the input voltage, and the inductor value, is larger than the average DC output current; this does not necessarily imply that the DC output current is negative. When SW2 turns off, the node potential $V_{SW}$ begins to increase. The difference between $V_{SW}$ and $V_{IN}$ shrinks, so that when SW1 is turned on, only a small step in voltage results, and thus the peak value of $dV_{SW}/dt$ falls with increasing dead time DT1. At the ZVS condition, the node voltage has risen to exactly $V_{IN}$ at the moment when SW1 turns on, and no step at all is present. This is the optimal efficiency condition, since all charge stored on the parasitic capacitance of switch SW1 has been directed into the load. Longer dead times will not lead to improved efficiency or a further reduction in the positive peak value of $dV_{SW}/dt$.

From consideration of the discussion above, it can be seen that the optimal setting for DT1 is that where the positive-going peak value of $dV_{SW}/dt$ is minimized, for either positive or negative inductor current. Therefore, to optimize DT1, one need merely search for the minimum value of the positive-going peak of $dV_{SW}/dt$, without needing to establish the sign of output current at the moment of transition.

Note, however, that when the inductor current is small in magnitude at the moment SW2 turns off, changes of $V_{SW}$ during the dead time DT1 will be very slow, and the switching voltage may not reach $V_{IN}$ if the energy stored in the inductor current is to small to charge the node capacitance sufficiently. Optimization of DT1 in this condition will be at the cost of excessive dead times, limiting the duty cycle that can be used with a fixed switching frequency. Fixed switching frequency is often desirable, for example where a fixed filter is used to remove electromagnetic interference due to the switching converter. Therefore, in the case where very large or very small duty cycles must be supported at fixed switching frequency, it is necessary to constrain the dead time DT1 to be no larger than some maximum value selected based on the requirements of the application.

Figure 8:
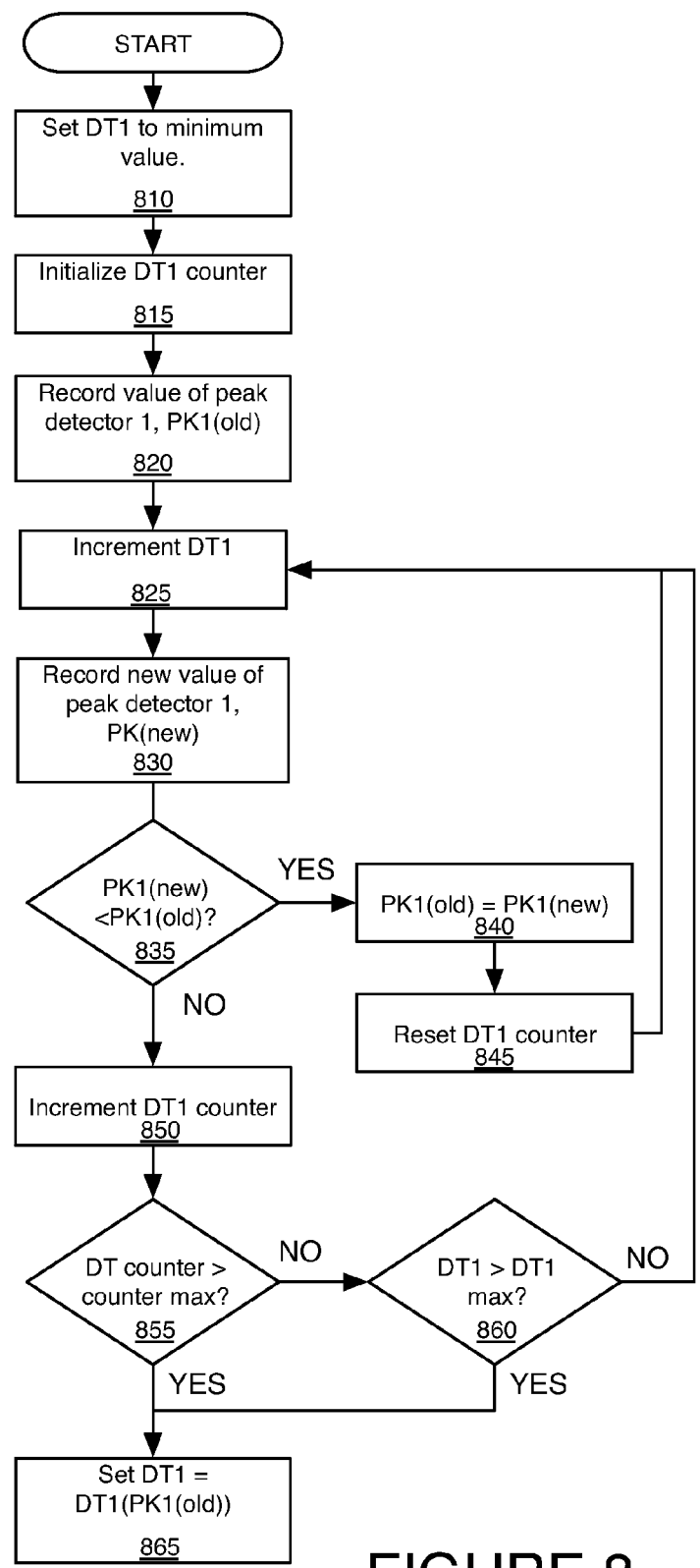
FIG. 8 is a flow chart that includes the steps of an example of a method of optimizing the first dead time (DT1).

An exemplary procedure for optimizing DT1, based on the discussion above, is depicted in FIG. 8. In the initial condition (step 810), DT1 is set to the minimum value allowed; in the exemplary embodiment, this minimum value is nominally 0, so that the falling edge of SW2 and the rising edge of SW1 overlap. A counter, which will be employed to limit the duration of the search for an improved value of PK1, is reset (step 815). The positive peak value of $dV_{SW}/dt$, here denoted PK1, is detected and stored as the value PK1 (old) (step 820). The dead time DT1 is then incremented (step 825) by a convenient time, and the positive peak value of $dV_{SW}/dt$ is measured and denoted PK1 (new) (step 830).

If PK1 (new) is less than PK1 (old) (step 835), a new local minimum has been found in PK1, presumed to correspond to a more optimal value of DT1. The old best value, PK1 (old), is replaced by the new value PK1 (new) (step 840), and the counter is reset (step 845).

If PK1 (new) is greater than or equal to PK1 (old) (step 835), no improved dead time has yet been discovered. The counter is incremented (step 850). If the counter exceeds the maximum allowed value (step 855), indicating that no improved dead time has been found after sufficient search, the process is terminated (step 865), and the dead time at which the value PK1 (old) was found is used as the new optimal value. If the counter has not yet reached its maximum (step 860), but the current value of dead time DT1 exceeds the largest allowed value DT1max (which may be imposed, as noted above, to avoid excessive dead times and constraints on duty cycle), the process is again terminated and the best value found, DT1 (PK1 (old)), is used as the new optimal value. If neither counter expiration nor maximum DT1 value has been reached, DT1 is again incremented and the search continues.

The result of this procedure is to set the dead time DT1 to the value corresponding to the minimum positive peak value of $dV_{SW}/dt$ within the allocated search range. If inductor current is positive when SW2 turns off, DT1 is set to a value near 0. If the inductor current is negative when SW2 turns off, DT1 is set to the value that achieves Zero Voltage Switching, or as close as possible thereto given any constraint on the maximum value of DT1.

Other variant approaches to accomplishing the same end may be employed, as dictated by the requirements of the envisioned application. For example, instead of initializing DT1 to a minimum value in every case, it may be set to a different value, such as the most recent optimized value. The search for a minimum may then proceed in either or both directions (that is, through incrementing DT1, decrementing DT1, or both). The use of a counter to limit search extent may be eschewed, so that the search always spans all allowed values of DT1 from the smallest value achievable to the largest value allowed.

Sample intervals up to and including sampling PK1 every switching cycle, may be employed if sufficiently fast conversion and processing of the resulting data is available. In an exemplary embodiment, PK1 is sampled by an analog-to-digital converter (ADC) every $16^{th}$ or $32^{nd}$ switching cycle for a converter with switching frequency=35 MHz. The inventors have found that when such a procedure is employed, it is not necessary to average PK1 over multiple switching cycles to obtain reliable results. However, averaging of successive measurements of PK1 over multiple switching cycles may be useful when, for example, slower switching frequencies are used, reducing the magnitude of the derivative peak signal.

Calibration of Dead Time 2

Dead time DT2 occurs after the series switch SW1 is turned off, but before the shunt switch SW2 is turned on. The overall result of these two steps is to change the switch node potential $V_{SW}$ from a value close to the supply voltage $V_{IN}$ to a value close to the ground potential (0 V). In the typical case where the supply voltage is positive, this corresponds to a net decrease in $V_{SW}$, so it is necessary that $dV_{SW}/dt$ be negative for at least a portion of the transition between the states SW1 on/SW2 off and SW2 on/SW1 off.

Figure 9:
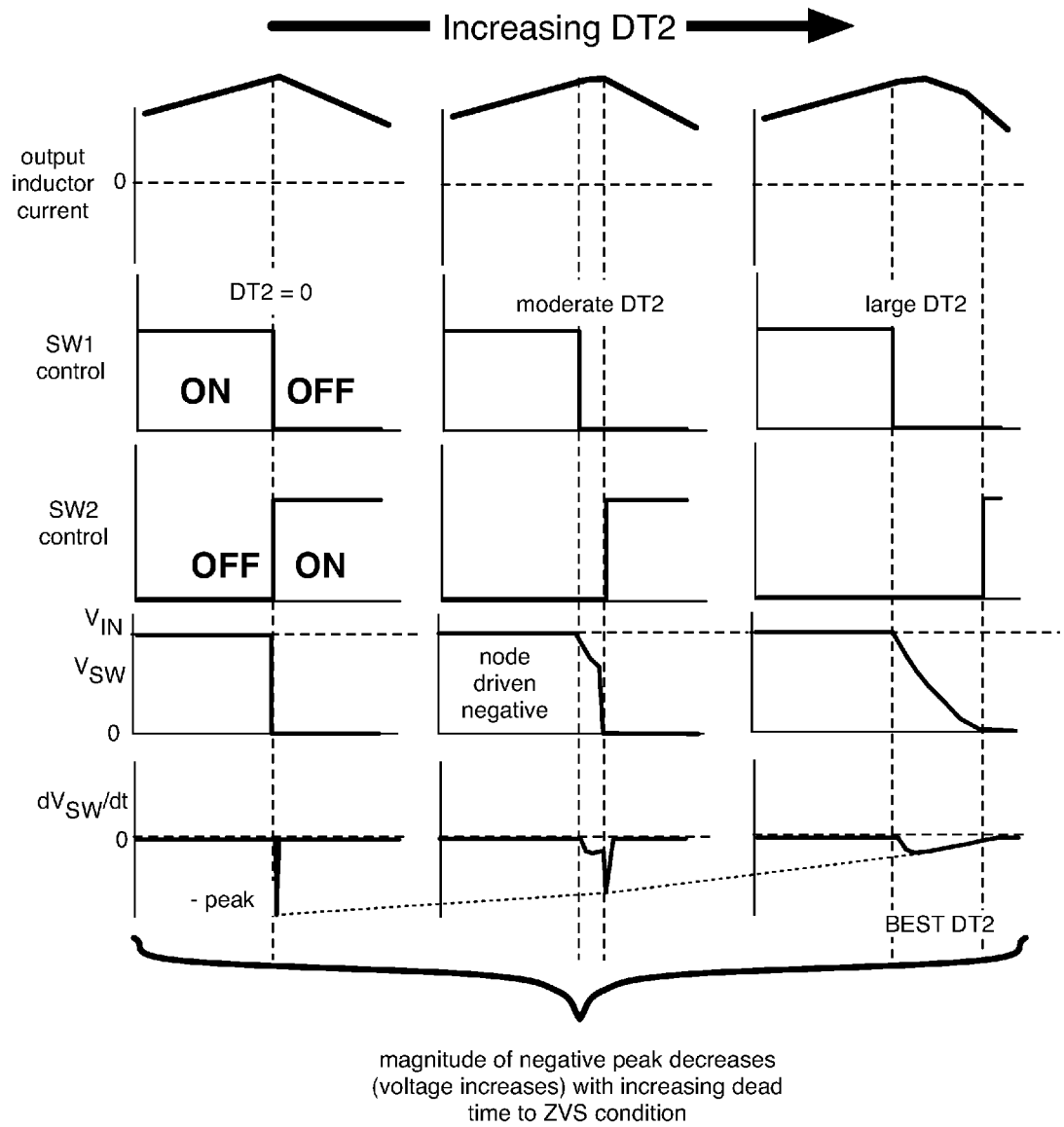
FIG. 9 is a timing diagram that shows an example of the behavior of a switching node potential and time derivative during a second dead time (DT2) when the current through an output inductor is positive.

The DT2 transition normally occurs with the output inductor current at the peak positive value, so negative current flow need not be considered unless the DC current is itself negative (a case to be discussed below). For positive output current, the potential of the switching node falls after SW1 turns off. The consequent behavior of $V_{SW}$ and $dV_{SW}/dt$ with varying duration of DT2 is shown in FIG. 9. As DT2 increases, the magnitude of the negative voltage step to 0 V shrinks The location at which the magnitude of the detected peak is decreasing most rapidly is a good approximation to the ZVS condition. If DT2 continues past this point, the $V_{SW}$ node again becomes negative, and is clamped by the body diode or the diode action of the FET itself, so that the negative peak becomes independent of DT2. Thus, the optimal value of DT2 may be approximated as that location where the magnitude of the negative detected peak is decreasing and the derivative with respect to DT2 is maximized.

Note that $dV_{SW}/dt(peak)$ is a negative quantity. In practical implementations, as described in connection with FIG. 10 and FIG. 11 below, an offset may be used so that the actual value input to the procedure is $(VOFFSET+dV_{SW}/dt(peak))>0$, such that the result is a positive voltage that may be readily converted into a digital value using a conventional analog-to-digital converter. In this case, the minimum absolute value of $dV_{SW}/dt(peak)$, is the MAXIMUM value of the measured voltage $(VOFFSET+dV_{SW}/dt(peak))$. A quantity PK2 can be defined as $PK2=(VOFFSET+dV_{SW}/dt(peak))$. PK2 has positive values between 0 and some maximum possible value. PK=0 corresponds to a large negative peak derivative of $V_{SW}$; PK2=PK2MAX corresponds to no negative peak derivative. Thus the best operating condition for DT2 is found when PK2 is INCREASING and d(PK2)/d(DT2) is maximized.

Figure 10:
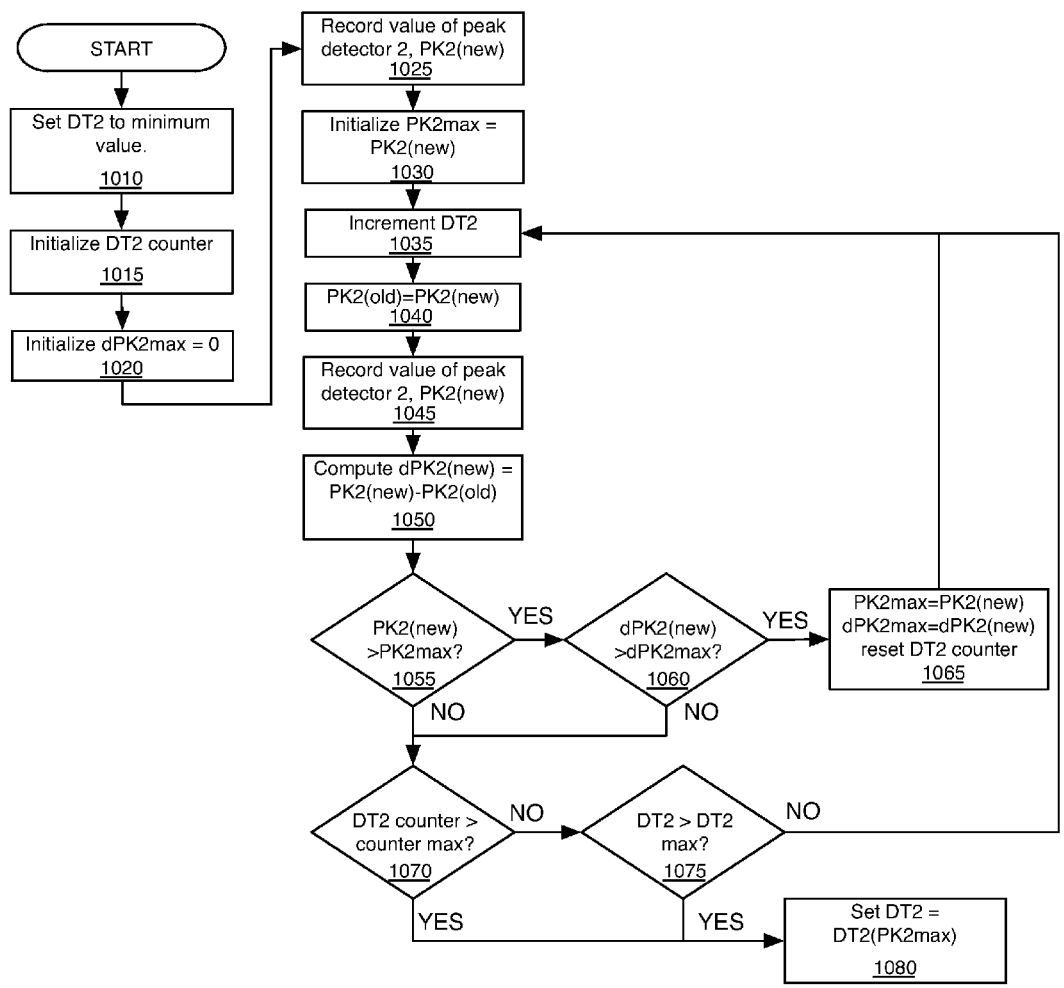
FIG. 10 is a flow chart that includes the steps of an example of a method of optimizing the second dead time (DT2).

An exemplary procedure for optimizing DT2 according to the discussion above is shown in FIG. 10. In the initial condition, DT2 is set to the minimum value allowed (step 1010); in the exemplary embodiment, this minimum value is nominally 0, so that the falling edge of SW1 and the rising edge of SW2 overlap. A counter, which is employed to limit the duration of the search for an improved value of the negative-going peak, is reset. A DT2 counter is initialized (step 1015). A value of PK2max is set to zero (step 1020). The value of PK2 is detected (step 1025) and initialized (step 1030) as the current value PK2(new), and the maximum value so far encountered, PK2max.

DT2 is then incremented (step 1035). The previous value of PK2 is stored (step 1040): PK2(old)=PK2(new). A new value of the negative-going peak is detected and assigned to PK2 (new) (step 1045), and a new value for the change due to DT2, dPK2(new), can be computed (step 1050). If both PK2(new) >PK2max (step 1055), and dPK2(new)>dPK2max (step 1060)—that is, if both the value of PK2 and the rate of change as we change DT2 are larger than the largest value encountered so far—new values for the maxima of the peak and its derivative are assigned with respect to DT2 (step 1065), reset the counter, and increment DT2 again. If either of these conditions fails, the maxima is not reset but instead whether the counter has expired is examined (step 1070), or the value of DT2 has reached the maximum value allowed (step 1075. If either condition is satisfied, the process is terminated and DT2 is set to the value corresponding to the joint maxima of PK2 and d(PK2)/d(DT2) (step 1080); otherwise, DT2 is incremented and the cycle repeated.

At the completion of this process, DT2 is set to a reasonable approximation of the value at which ZVS occurs, unless that value exceeds the maximum allowed DT2.

An exemplary architecture for performing the requisite measurements to support the procedure described above is shown in FIG. 11. The multiplexer and analog-to-digital converter (ADC) are substantially conventional designs. The skew detection input $I_{skew}$ is discussed below.

Figure 12:
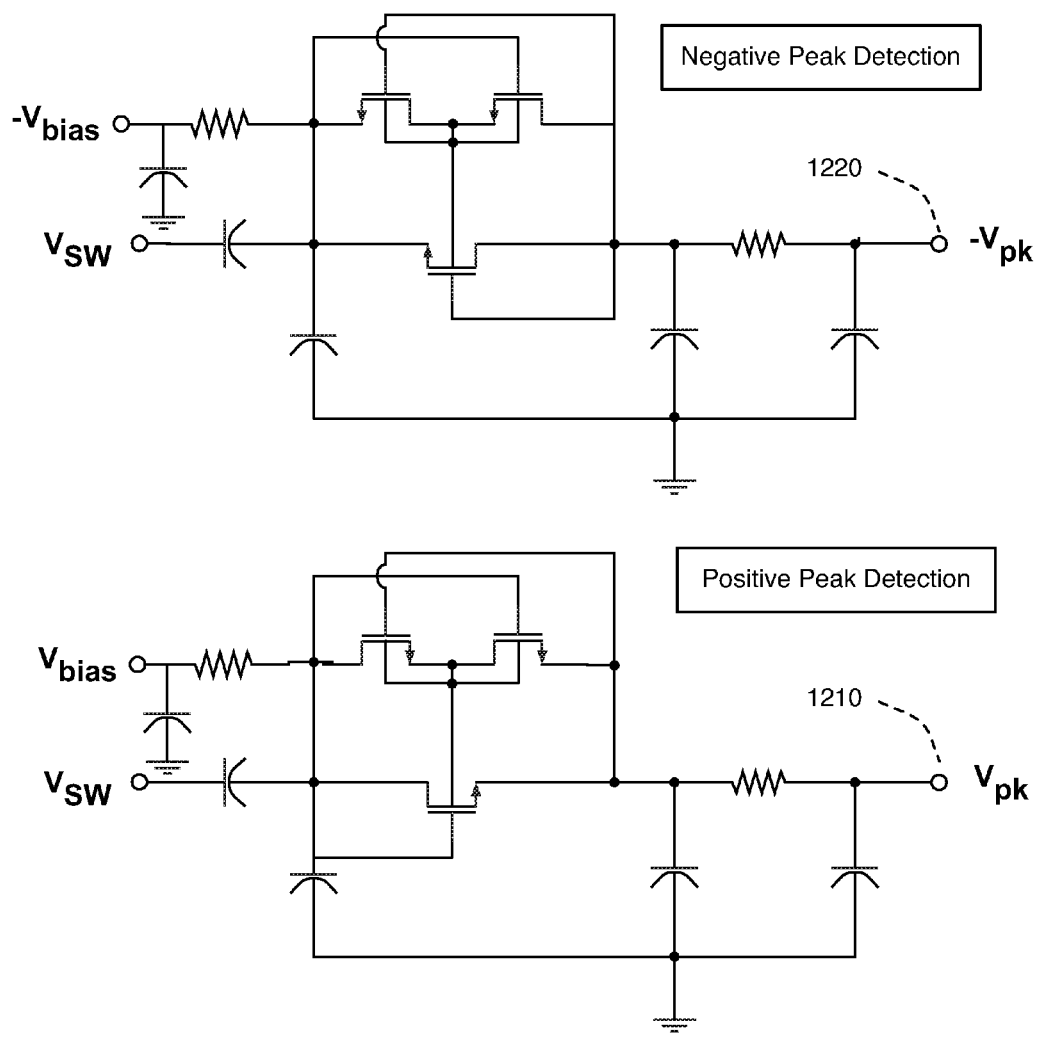
FIG. 12 shows examples of a negative and positive peak detection circuits.

Possible peak detection circuits are depicted in FIG. 12. The incoming signal is differentiated by the input capacitor network and the diode-connected transistor. In the exemplary implementation, a cross-coupled pair of FETs is used to ensure that the diode-connected FET's body potential is always negative. This design is appropriate for use with a high-switching-frequency converter where capacitive delays should be minimized. The peak-detected output is then filtered by a second R-C network. A bias voltage is required to adjust the desired operating point for each detector, to optimize the response for a given input voltage and ADC.

Particularly in the case of a high-switching-frequency converter, one cannot rely solely upon the intended relative timing of the control signals directed to SW1 and SW2, due to the possibility of differences in turn-on or turn-off delay for the series and shunt switches. A convenient approach to correcting timing errors is to provide an adjustable relative delay, the skew time, between the SW1 and SW2 control signals.

Figure 13:
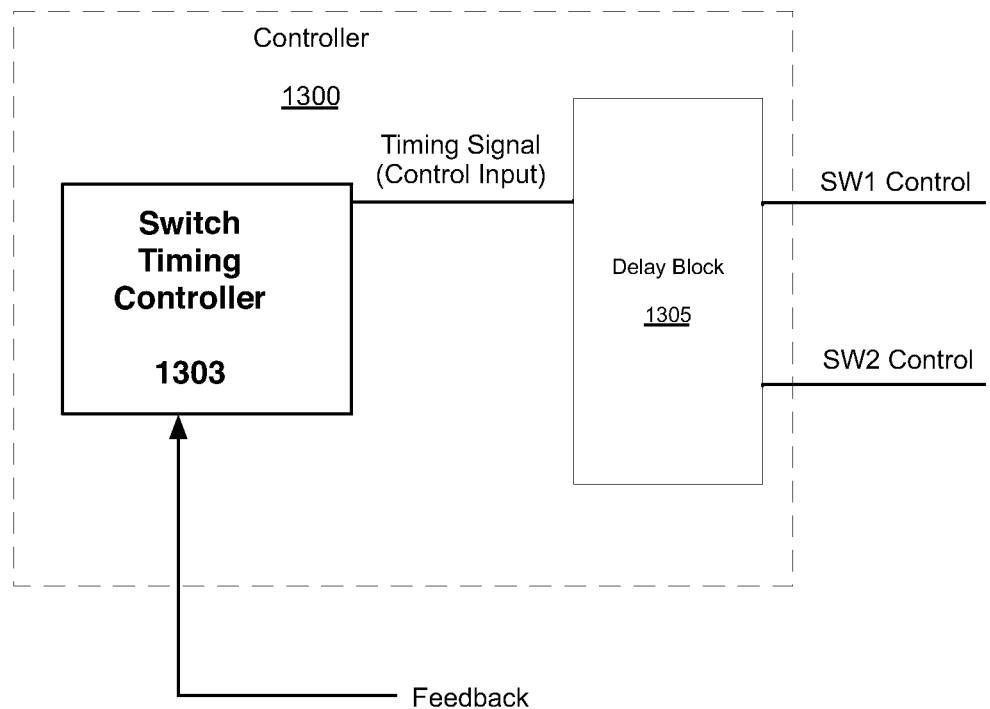
FIG. 13 shows an example of a switch timing controller and a delay block that control the timing of opening and closing of a series switch element and a shunt switch element.

FIG. 13 shows an example of a switch timing controller 1303 and a delay block 1305 of a controller 1300 that control the timing of opening and closing of a series switch element and a shunt switch element. As shown, the switch timing controller 1303 receive a feedback signal (for example, the switching voltage or the regulated output voltage) and generates a timing signal. The timing signal is received by the delay block 1305 which controls the timing of the switch control signals (SW1 and SW2). An embodiment of the delay block 1305 is shown in greater detail in FIG. 14.

Figure 14:
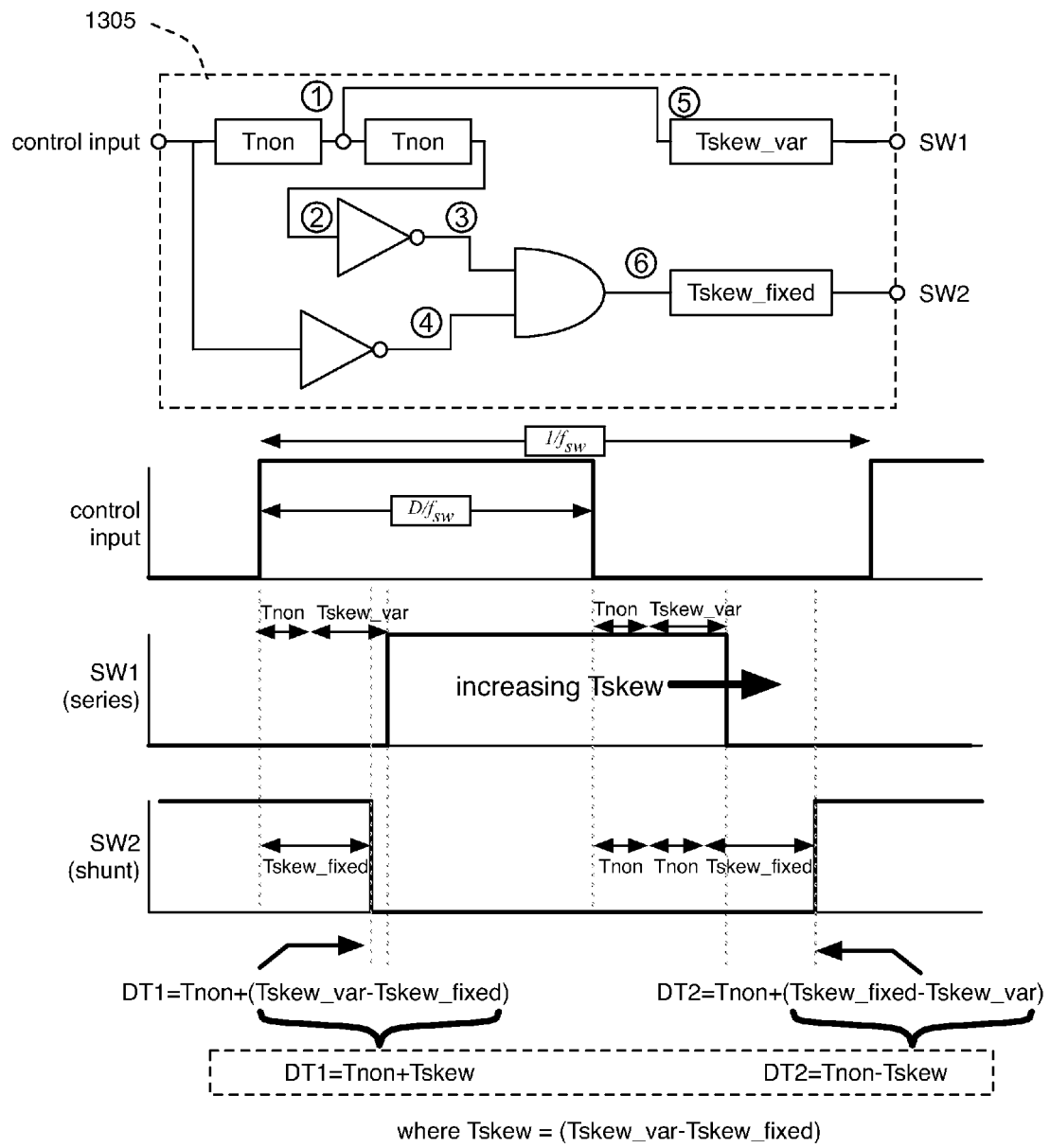
FIG. 14 shows an example of a control timing block that provides skew offset control.

An exemplary timing implementation providing such a skew offset is depicted in FIG. 14. Note that in this diagram, SW1 and SW2 are considered to be on when the corresponding output signals are positive. A subsequent inversion may be required in the case where e.g. SW1 is implemented as a PMOS rather than NMOS device. Other exemplary delay circuits can be used.

The delay block 1305 consists of two non-overlap delay blocks, labeled Tnon, and two skew delay blocks, labeled Tskew_var and Tskew_fixed, are used. Tskew_fixed is used to allow effective negative values of relative delay. In the exemplary implementation, these delay blocks consist of 32 identical delays cells, each composed of two inverters in series, configured so that an incoming signal can pass through (and suffer the delay of) any number of delay cells from 1 to 32, depending on a binary code. However, any appropriate means of adjustable delay of a digital signal may be employed. The control input is delayed by the sum of Tnon and Tskew_var before being passed on to the SW1 input. When the control input goes high, the SW2 input is forced low after a delay of Tskew_fixed. When the control input goes low, the AND gate is triggered after a delay of 2*Tnon, and the output of the AND gate is further delayed by Tskew_fixed. The result is that the delay between the time SW2 goes off and SW1 goes on (DT1—the first dead time) is:

$$DT1 = T_{non} + (T_{skew\_var} - T_{skew\_fixed})$$

The corresponding delay between the time SW1 goes off and SW2 goes on (DT2—the second dead time) is:

$$DT2 = T_{non} + (T_{skew\_fixed} - T_{skew\_var})$$

By defining a skew time Tskew=Tskew_var−Tskew_fixed, it becomes apparent that increasing Tskew has the effect of moving the SW1-on time to the right relative to the SW2 off time, thus increasing DT1 and decreasing DT2. The skew time Tskew_fixed may be fixed by design, measured when a specific part is placed in operation, or set by the use of a separate sensor, illustrated in this case by the skew current detector output $I_{skew}$.

By appropriately adjusting the values of Tskew and Tnon, the values of DT1 and DT2 may be independently set. Note that it is the differential delay between the SW1 and SW2 outputs, not the overall delay through the block 1305, that is varied.

Figure 15:
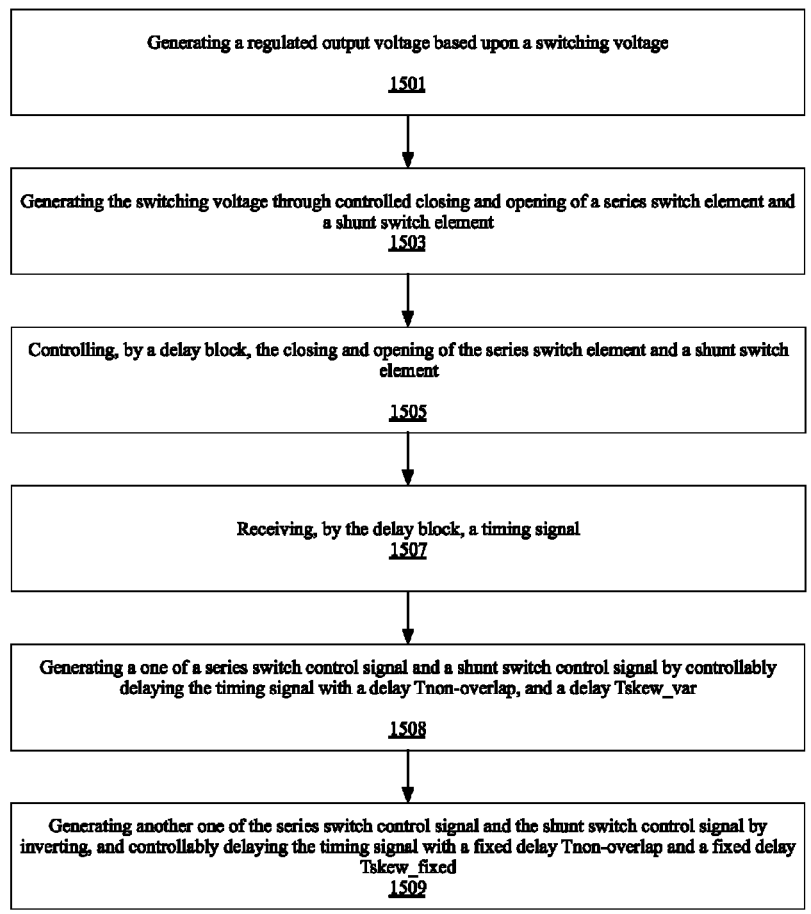
FIG. 15 is a flow chart of a method that includes an example of steps of a method of controlling timing of switch control signals of a switching voltage regulator.

FIG. 15 is a flow chart of a method that includes an example of steps of a method of controlling timing of switch control signals of a switching voltage regulator. A first step 1501 includes generating a regulated output voltage based upon a switching voltage. A step 1503 includes generating the switching voltage through controlled closing and opening of a series switch element and a shunt switch element. A step 1505 includes controlling, by a delay block, the closing and opening of the series switch element and a shunt switch element. Controlling the closing and opening of the series switch element and a shunt switch element includes a step 1507 that includes receiving, by the delay block, a timing signal, and a step 1508 that includes generating a one of a series switch control signal and a shunt switch control signal by controllably delaying the timing signal with a delay Tnon-overlap, and a delay Tskew_var, and a step 1509 that includes generating another one of the series switch control signal and the shunt switch control signal by inverting, and controllably delaying the timing signal with a fixed delay Tnon-overlap and a fixed delay Tskew_fixed.

As described, for an embodiment, the delay Tnon-overlap, the delay Tskew_var and the fixed delay Tskew_fixed determine a dead time, wherein the dead time includes time that both the series switch element and the shunt switch element are open. As described, for embodiments, the dead time includes a first dead time and a second dead time, wherein the first dead time and the second dead time are independently adjusted by adjusting the delay Tnon-overlap and the Tskew_var.

Figure 16:
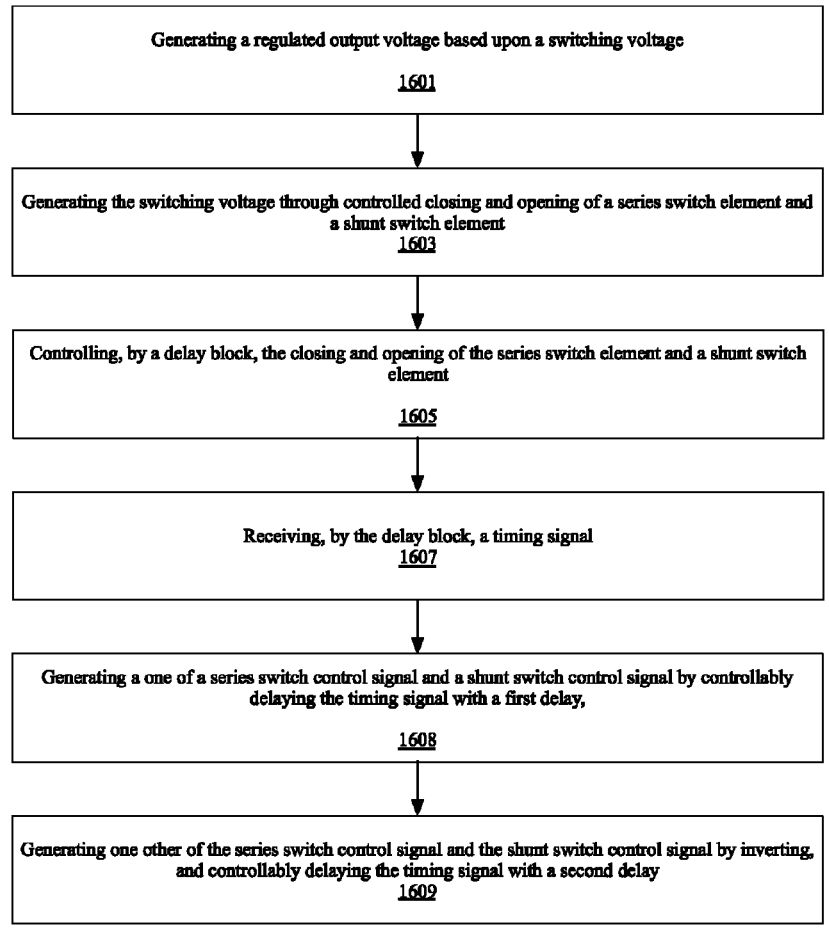
FIG. 16 is a flow chart of another method that includes an example of steps of a method of controlling timing of switch control signals of a switching voltage regulator.

FIG. 16 is a flow chart of another method that includes an example of steps of a method of controlling timing of switch control signals of a switching voltage regulator. A first step 1601 includes generating a regulated output voltage based upon a switching voltage. A step 1603 includes generating the switching voltage through controlled closing and opening of a series switch element and a shunt switch element. A step 1605 includes controlling, by a delay block, the closing and opening of the series switch element and a shunt switch element. Controlling the closing and opening of the series switch element and a shunt switch element includes a step 1607 that includes receiving, by the delay block, a timing signal, a step 1608 includes generating a one of a series switch control signal and a shunt switch control signal by controllably delaying the timing signal with a first delay, and a step 1609 includes generating one other of the series switch control signal and the shunt switch control signal by inverting, and controllably delaying the timing signal with a second delay.

An embodiment (as depicted in FIG. 14) further includes inverting the timing signal and functionally applying the inverted timing signal and the timing signal controllably delayed with the second delay to an AND function for generating the other of the series switch control signal and the shunt switch control signal. Another embodiment (also as depicted in FIG. 14) further includes generating a first of the series switch control signal and the shunt switch control signal by controllably delaying the timing signal that has been with a first delay with a first skew delay, and generating a second of the first of the series switch control signal and the shunt switch control signal by controllably delaying an output of the AND function with a second skew delay. It should be noted, that in some embodiments, either or both of the first skew delay and the second skew delay can be set to zero.

For an embodiment, the first skew delay and the second skew delay are selected to prevent a condition in which both the series switch element and a shunt switch element are turned on at the same time. An embodiment further includes controllably selecting an "on" time of at least one of the series switch control signal and the shunt switch control signal to be different than an "off" time of the other of the series switch control signal and the shunt switch control signal. As described, an embodiment includes the first delay, the second delay and the selectable "on" time of the at least one of the series switch control signal and the shunt switch control signal determining a dead time, wherein the dead time includes time that both the series switch element and the shunt switch element are open.

For an embodiment, the timing signal is based on the regulated output voltage. For an embodiment, the timing signal is based on the switching voltage. As described, for an embodiment, the timing signal is based on a rate of change of the switching voltage.

Figure 17:
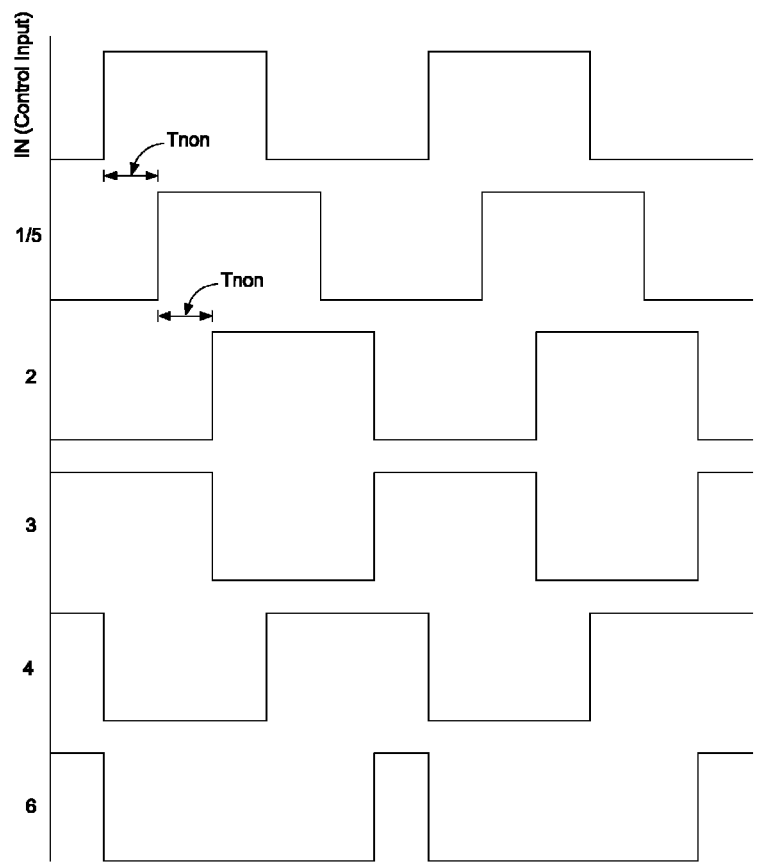
FIG. 17 shows examples of timing diagrams of waveforms of signals designated in FIG. 14.

FIG. 17 shows examples of timing diagrams of waveforms of signals designated in FIG. 14. More specifically, FIG. 17 shows an example of timing of waveforms at the points designated as "1", "2", "3", "4", "5" and "6". The points switch control waveforms before being delayed by the fixed and variable skew delays. The notable characteristic of the waveform 5 and 6 is that the "on-time" of the waveform 5 is centered within the "off-time" of the waveform 6, thus ensuring that the two switches are not simultaneously on. The selection of the skew times should also be made to ensure that the two (series and shunt) are not simultaneously turned on.

Calibration Examples

Figure 11:
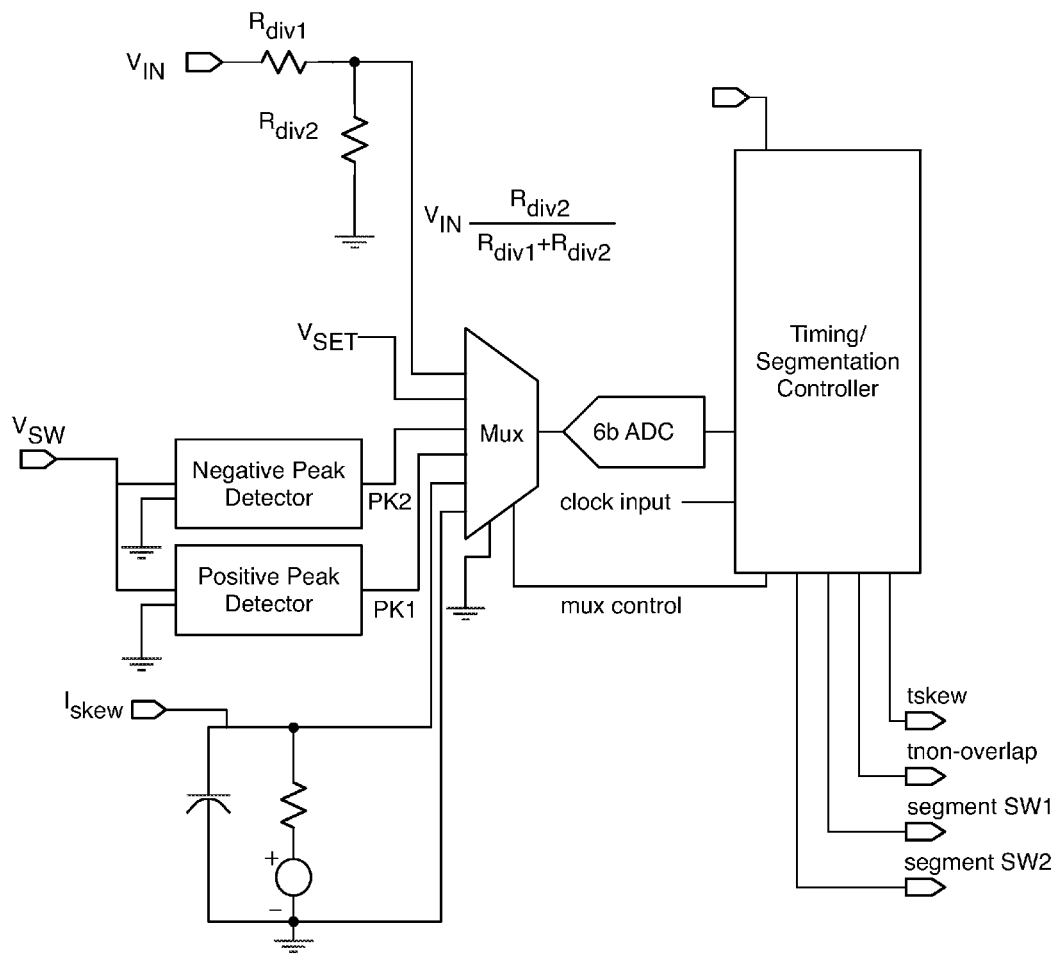
FIG. 11 is an example of a block diagram of a circuit for calibrating the dead times DT1, DT2.
Figure 18:
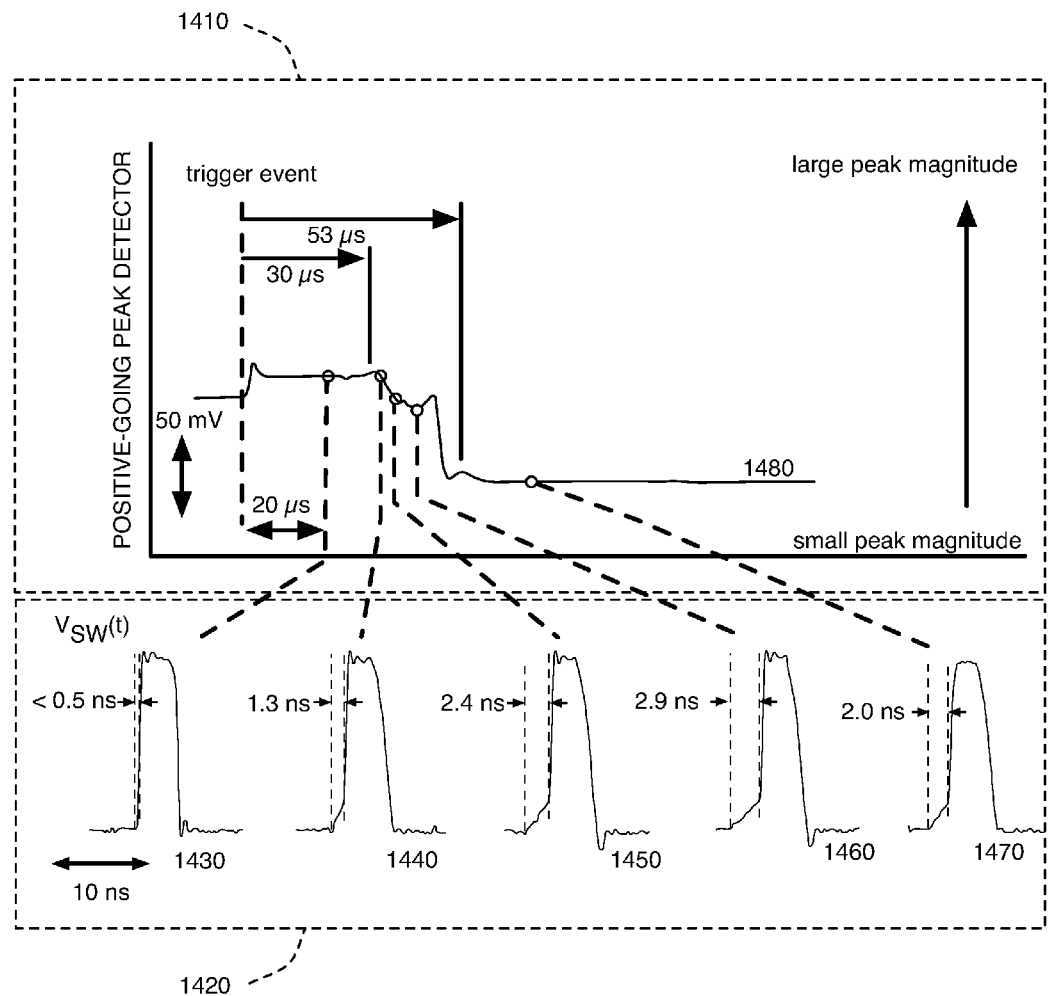
FIG. 18 shows an example of calibration of the positive-going peak (corresponding to DT1).

FIG. 18 shows an example of calibration of the positive-going peak (corresponding to DT1). A switching converter operating at a nominal $f_{SW}$=35 MHz, with input voltage of 3.7 V, employing the implementation described in FIGS. 11 and 12, is used. The positive peak detector output 1210 is shown versus time in box 1410 as the curve 1480. The behavior of the switching node voltage versus time (on a much shorter time scale) for various points in the calibration procedure is shown by the curves 1430 through 1470 in box 1420. The calibration procedure begins when a trigger event occurs, in this case a change in the commanded output voltage from 1.8 V to 0.55 V. The load resistance is about 10 ohms, so the final output current is about 55 mA. A 100-nH output inductor is in use, and the final duty cycle is about 17%, so the expected peak-to-peak ripple current is about 150 mA; therefore, we expect a small negative current to be flowing during the period corresponding to DT1. During the initial period after the trigger event, the dead times are temporarily set at their minimum values while the analog output voltage settles, as shown by curve 1430. In this example, no separate skew adjustment is performed. Roughly 30 microseconds after the trigger event, the timing calibration process begins. The duration of DT1 is successively increased, as shown by the series of curves 1440, 1450, and 1460, resulting in decreasing values of the peak detector output 1480. In this case, only 5 bits of the 6 available ADC bits are used to minimize the size of the resulting computational block, so the computation cannot distinguish between the curves 1450 and 1460, but recognizes that the dead times in 1430 and 1440 are too short. The final condition, shown as curve 1470, has selected a dead time duration DT1 longer than the initial value, but not quite as long as the optimal value corresponding to curve 1460. (Note that DT2 has also been adjusted during this calibration process; the details of a DT2 calibration are discussed in connection with FIG. 15 below.)

Figure 19:
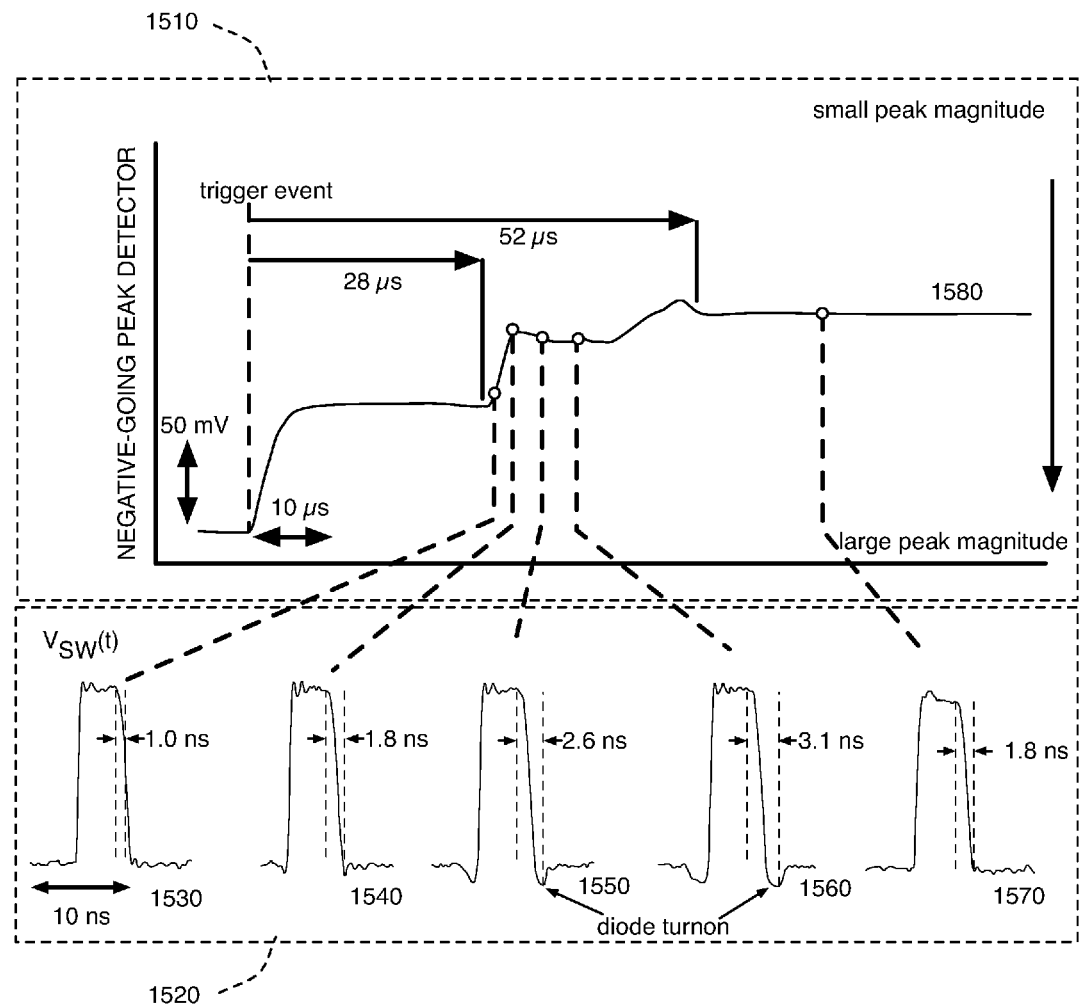
FIG. 19 shows an example of calibration of the negative-going peak (corresponding to DT2).

FIG. 19 shows an example of calibration of the negative-going peak (corresponding to DT2) for the same converter described in connection with FIG. 15. The negative peak detector output 1220 is shown versus time in box 1510 as the curve 1580. The behavior of the switching node voltage versus time (on a much shorter time scale) for various points in the calibration procedure is shown by the curves 1530 through 1570 in box 1520. The trigger event in this case is a change in the requested output voltage from 1.9 V to 0.63 V. The load resistance is about 5 ohms, and the final DC output current is about 130 mA. Thus, output current remains positive at all points during the switching cycle. The calibration algorithm allows about 28 microseconds after the trigger event for the output voltage to settle, during which the dead times are set to small values, as depicted by the curve 1530. The calibration starts by increasing DT2, leading to an increase in the peak detector output, corresponding as shown in the diagram to a decreased magnitude of the negative-going peak. Curve 1540 shows that a moderately longer dead time DT2 has produced a smaller negative-going peak. Further increases in dead time, depicted by curves 1550 and 1560, do not produce any further reduction in the peak magnitude. It is also apparent that the DT2 durations in curves 1550 and 1560 are longer than optimal, causing the node voltage to become negative and drawing current through the associated diodes, as described previously. Thus, the computation returns to the dead time used in curve 1540 in the final settled timing shown in curve 1570.

At very high conversion ratios, pulse-width-modulated (PWM) controllers may be subject to subharmonic operation and missed pulses. This behavior leads to noise in the peak detector circuits and should be avoided. A means of avoiding subharmonic operation at high conversion ratios using a variable autobypass element has been disclosed in the U.S. patent application Ser. No. 12/730,333, titled "Voltage Regulator Bypass Resistance Control", herein incorporated by reference. The operation of the autobypass element may be sensed in various fashions, by examining the conversion ratio $V_{OUT}/V_{IN}$, the difference $V_{OUT}-V_{IN}$, the duty cycle D, or the bias applied to the autobypass gate or base contact. When an autobypass element is in operation, it is advisable to limit the allowed duration of the dead times to minimize the impact of any possible subharmonic noise. At high conversion ratios, the SW2 pulse can be short, depending on switching frequency, so that the minimum pulse duration may also limit the dead times that can be used. At sufficiently high conversion ratios, the autobypass element may supply essentially all the load current, and the switching element net current can become negative. Negative current can be detected as described above, or by direct current sensing. When switching current is negative, it is in principle possible to achieve ZVS on DT1, but in practice it is advisable to minimize the perimeter of the switching transistors to minimize power consumption therein, by turning off most of the segments of segmented switching transistors. In this case, the total power devoted to switching is small, and timing calibration may be omitted, with the dead times set to their minimum values.

Application to a Boost Converter

Figure 20:
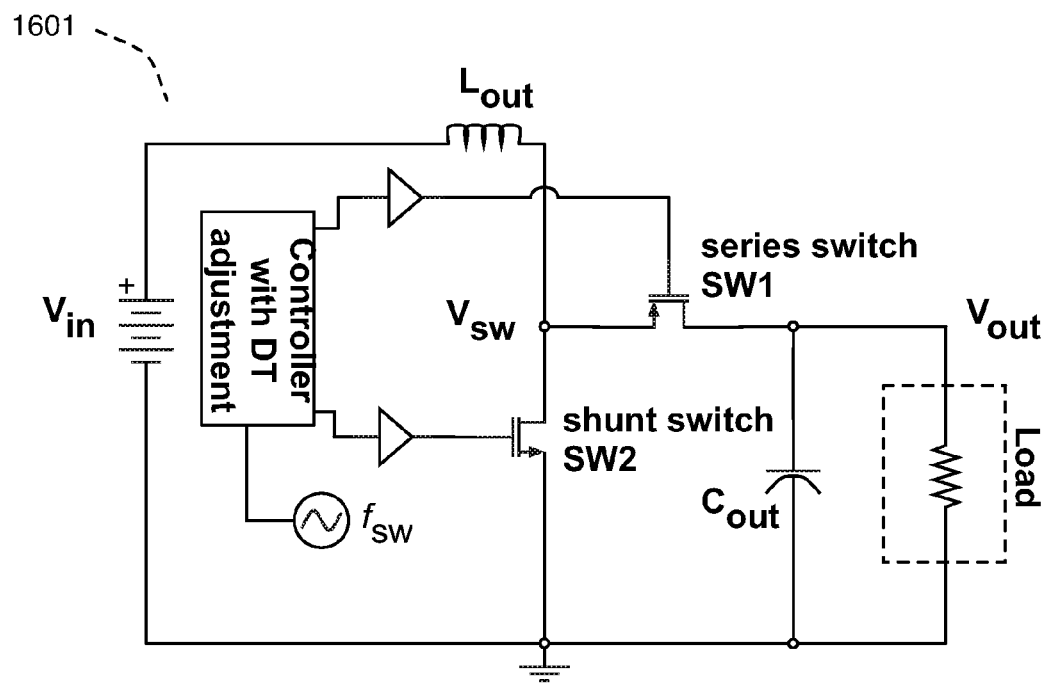
FIG. 20 shows an example an example of a boost voltage converter that includes delay time control
Figure 21:
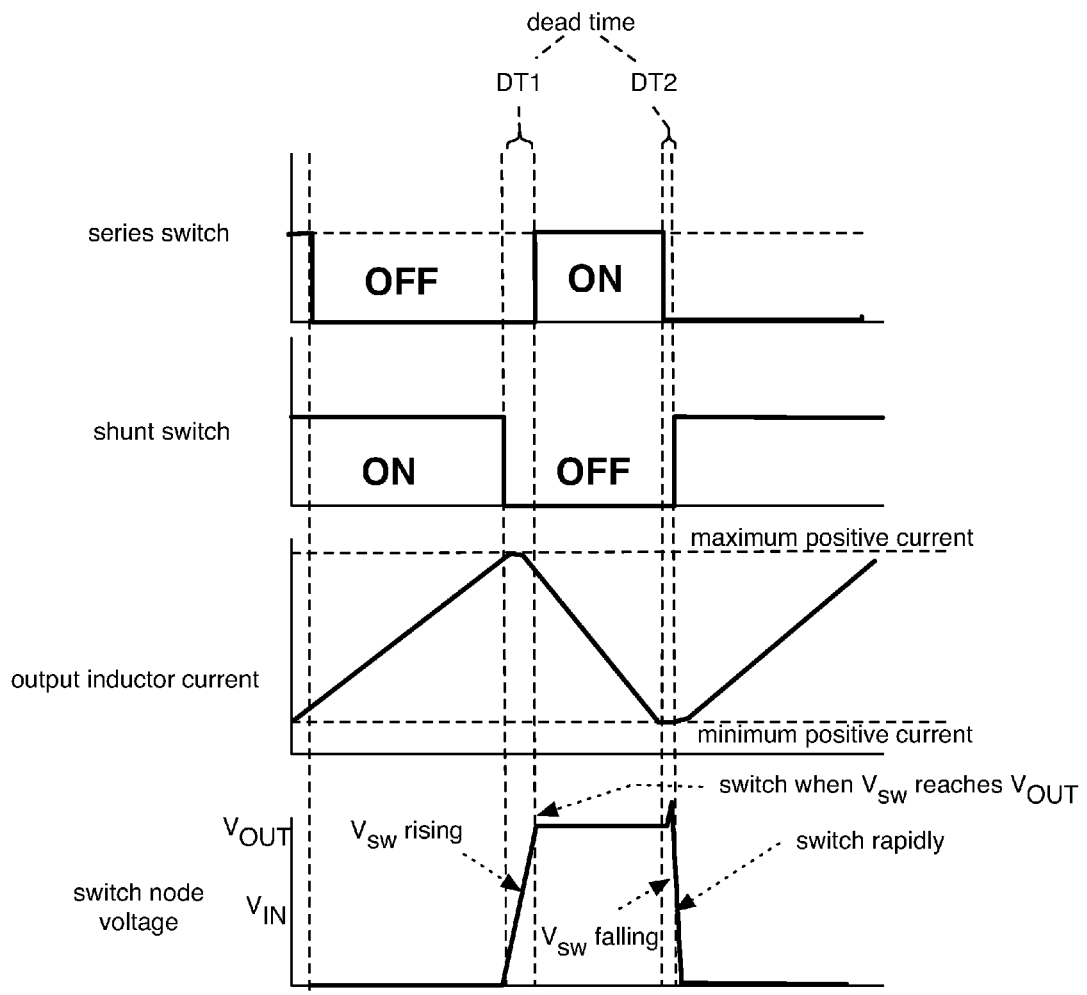
FIG. 21 shows examples of a timing diagram of a boost converter, showing dead times and switch node voltage behavior.

The principles of the invention have been described above in connection with a buck converter, but the invention may also be applied to a boost converter, with the understanding that the role of the two switches is modified. FIG. 20 shows an example of a simplified boost converter. Shunt switch SW2 is closed to cause a current to flow through output inductor $L_{out}$ to ground. After a suitable period of time, SW2 is opened, causing the voltage at the switching node $V_{SW}$ to increase as the node capacitance is charged by the inductor. When the voltage reaches the desired value, SW1 is closed, allowing the inductor to charge the output capacitor. The corresponding time-dependent inductor current and switching node voltage are depicted schematically in FIG. 21. In this case, the dead time DT1 corresponds to the time after the shunt switch is turned OFF, prior to the series switch turning ON. DT1 is optimally adjusted to allow $V_{SW}$ to rise to the output voltage at the moment of switching the series switch ON, achieving zero-voltage switching in a fashion analogous to that described above in connection with the buck converter configuration. DT2, here corresponding to the time after the series switch is turned OFF and prior to the shunt switch turning ON again, should optimally be short, since any charge placed on the switching node is simply dissipated to ground when SW2 turns on. The same principles described above can thus be applied to the boost configuration, where the dead times are adjusted to minimize the peak value of the corresponding derivative of the switching node voltage with respect to time.

Although specific embodiments have been described and illustrated, the embodiments are not to be limited to the specific forms or arrangements of parts so described and illustrated.

What is claimed:

1. A method of controlling timing of switch control signals of a switching voltage regulator, comprising:
    generating a regulated output voltage based upon a switching voltage;
    generating the switching voltage through controlled closing and opening of a series switch element and a shunt switch element;
    controlling, by a delay block, the closing and opening of the series switch element and a shunt switch element, comprising;
        receiving, by the delay block, a timing signal;
        generating a series switch control signal by controllably delaying the timing signal with a first delay, wherein both rising and falling edges of the timing signal are delayed by the first delay, and wherein the first delay includes a sum of a non-overlap time Tnon and a variable skew delay Tskew_var; and
        generating the shunt switch control signal by inverting the timing signal, comparing the inverted timing signal with a delayed inverted timing signal, wherein the delayed inverted timing signal is delayed by a second delay, wherein the second delay includes two of the non-overlap time Tnon, wherein an intermediate output is generated by comparing the inverted signal and the delayed inverted signal, and wherein the shunt switch control signal is generated by further delaying the intermediate output by a delay Tskew_fixed.

2. The method of claim 1, wherein the delay Tnon-overlap, the delay Tskew_var and the fixed delay Tskew_fixed determine a dead time, wherein the dead time comprises time that both the series switch element and the shunt switch element are open.

3. The method of claim 2, wherein the dead time comprises a first dead time and a second dead time, wherein the first dead time and the second dead time are independently adjusted by adjusting the delay Tnon-overlap and the Tskew_var.

4. The method of claim 1, wherein Tskew_fixed is adjustable independent of Tskew_var.

5. The method of claim 1, wherein the delay Tnon determines a total non-overlap time of the series and shunt switches, and the delays Tskew_var and Tskew_fixed determine an allocation of the total non-overlap time to a first dead time and a second dead time, wherein the dead time comprises the first dead time and the second dead time.

6. The method of claim 1, wherein time durations of the delays Tskew_var and Tskew_fixed are selectable to provide both positive and negative dead times.

7. The method of claim 6, wherein a negative dead time results when selecting Tskew_var and Tskew_fixed so that a Tskew is less than zero and greater in magnitude than Tnon.

8. A switching voltage regulator, comprising:
    a series switch element;
    a shunt switch element;
    a switching controller operative to generate a switching voltage through controlled closing and opening of a series switch element and a shunt switch element;
    a delay block operative to receive a timing signal, and control the closing and opening of the series switch element and a shunt switch element by generating a series switch control signal by controllably delaying the timing signal with a first delay, wherein both rising and falling edges of the timing signal are delayed by the first delay, and wherein the first delay includes a sum of a non-overlap time Tnon and a variable skew delay Tskew_var, and generating the shunt switch control signal by inverting the timing signal, comparing the inverted timing signal with a delayed inverted timing signal, wherein the delayed inverted timing signal is delayed by a second delay, wherein the second delay includes two of the non-overlap time Tnon, wherein an intermediate output is generated by comparing the inverted signal and the delayed inverted signal, and wherein the shunt switch control signal is generated by further delaying the intermediate output by a delay Tskew_fixed.

9. The switching regulator of claim 8, wherein Tskew_fixed is adjustable independent of Tskew_var.

10. The switching regulator of claim 8, wherein the delay Tnon determines a total non-overlap time of the series and shunt switches, and the delays Tskew_var and Tskew_fixed determine an allocation of the total non-overlap time to a first dead time and a second dead time, wherein the dead time comprises the first dead time and the second dead time.

11. The switching regulator of claim 8 wherein time durations of the delays Tskew_var and Tskew_fixed are selectable to provide both positive and negative dead times.

12. The switching regulator of claim 8, wherein a negative dead time results when selecting Tskew_var and Tskew_fixed so that a Tskew is less than zero and greater in magnitude than Tnon.

* * * * *